US009461342B2

(12) United States Patent
Saigo et al.

(10) Patent No.: US 9,461,342 B2
(45) Date of Patent: Oct. 4, 2016

(54) BATTERY STATE NOTIFYING UNIT, BUS BAR MODULE, BATTERY PACK, AND BATTERY STATE MONITORING SYSTEM

(75) Inventors: Tsutomu Saigo, Susono (JP); Akiyoshi Kanazawa, Susono (JP)

(73) Assignee: Yazaki Corporation, Tokyo (JP)

( * ) Notice: Subject to any disclaimer, the term of this patent is extended or adjusted under 35 U.S.C. 154(b) by 769 days.

(21) Appl. No.: 13/489,724

(22) Filed: Jun. 6, 2012

(65) Prior Publication Data

US 2012/0323511 A1   Dec. 20, 2012

(30) Foreign Application Priority Data

Jun. 14, 2011 (JP) ................................ 2011-131987

(51) Int. Cl.
  G06F 17/00 (2006.01)
  G01R 31/36 (2006.01)
  H01M 10/48 (2006.01)
  (Continued)

(52) U.S. Cl.
  CPC .......... *H01M 10/482* (2013.01); *H01M 2/206* (2013.01); *H01M 10/486* (2013.01); *H02J 7/0021* (2013.01); *G01R 31/3658* (2013.01); *G01R 31/3689* (2013.01); *G01R 31/3696* (2013.01); *G06F 17/00* (2013.01); *H01M 2010/4278* (2013.01); *H01M 2220/20* (2013.01); *Y02T 10/7055* (2013.01)

(58) Field of Classification Search
  CPC .......... G01R 31/3658; G01R 31/3606; G01R 31/3637; G01R 31/3696; H01M 2/208; H02J 7/0021; H02J 7/0026
  USPC ........................................................ 702/63
  See application file for complete search history.

(56) References Cited

U.S. PATENT DOCUMENTS

| 5,670,861 A | 9/1997 | Nor | |
|---|---|---|---|
| 2009/0159354 A1* | 6/2009 | Jiang et al. ................. | 180/68.5 |
| 2011/0076521 A1 | 3/2011 | Shimizu et al. | |

FOREIGN PATENT DOCUMENTS

| EP | 1468863 A2 | 10/2004 |
|---|---|---|
| JP | 2003047111 A | 2/2003 |

(Continued)

OTHER PUBLICATIONS

Office Action dated Jun. 10, 2014, issued for the Chinese patent application No. 201210193985.5 and English translation thereof.

(Continued)

*Primary Examiner* — John Breene
*Assistant Examiner* — Lynda Dinh
(74) *Attorney, Agent, or Firm* — Locke Lord LLP; James E. Armstrong, IV; Brian S. Matross

(57) ABSTRACT

A battery state notifying unit, a bus bar module, a battery pack and a battery state monitoring system are provided, and allow for reduction of the number of electric wires guided to a unit monitoring a battery state, and the signal voltage applied to the electric wires. A battery power source system is provided with a battery state notifying unit corresponding to each battery pack. The battery state notifying unit generates battery state information indicating the electrode voltage and temperature of the battery cells 21, and transmits the battery state information to the battery state monitoring unit. The battery state information is based on a cell voltage signal corresponding to electrode voltage outputted from terminal fittings of the battery pack, and a cell temperature signal corresponding to voltage outputted from the temperature sensor.

19 Claims, 19 Drawing Sheets

(51) Int. Cl.
*H01M 2/20* (2006.01)
*H02J 7/00* (2006.01)
*H01M 10/42* (2006.01)

(56) References Cited

FOREIGN PATENT DOCUMENTS

| JP | 2009005544 A | 1/2009 |
|---|---|---|
| JP | 2009289431 A | 12/2009 |
| JP | 2011-076936 A | 4/2011 |
| WO | WO-2010/113455 A1 | 10/2010 |
| WO | WO2012034045 A1 * | 3/2012 |

OTHER PUBLICATIONS

Notification of Reasons for Refusal, issued in corresponding Japanese Patent Application No. JP 2011-131987, dated Jan. 27, 2015.

* cited by examiner

FIG. 6
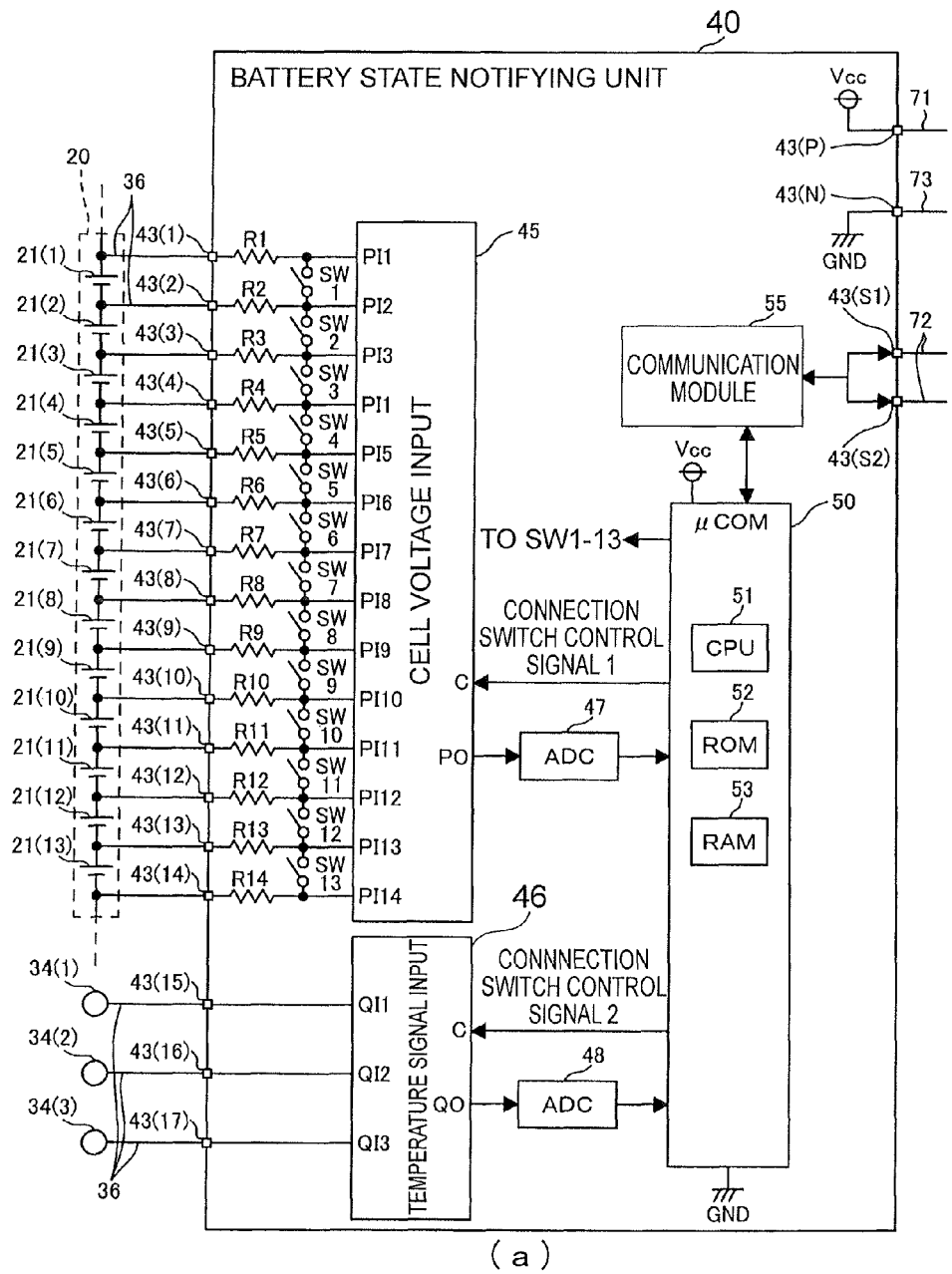
(a)
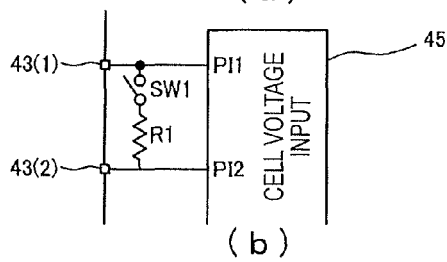
(b)

BATTERY STATE NOTIFYING UNIT, BUS BAR MODULE, BATTERY PACK, AND BATTERY STATE MONITORING SYSTEM

TECHNICAL FIELD

This invention relates to a battery state notifying unit utilized for monitoring a state of battery pack mounted in, e.g., a hybrid electric vehicle or an electric vehicle, a bus bar module and a battery pack having the battery state notifying unit, and a battery state monitoring system having the battery state notifying unit.

BACKGROUND ART

Recently, there has prevailed a hybrid electric vehicle (hereinafter referred to as HEV) jointly using an engine and an electric motor, or an electric vehicle traveling only with an electric motor. For example, the HEV is provided with two types of batteries, one type of which is a low voltage battery of about 12 volts for engine starter and car electric devices, the other type of which is a high voltage battery for driving the electric motor. The above-mentioned high voltage battery is given high voltage in such a way that a secondary cell such as a nickel hydride battery or a lithium battery is, as a unit cell, i.e., battery cell, connected in series to compose a battery pack (see, e.g., PTL 1).

The above-mentioned high voltage battery induces variation of an electrode voltage of each of the battery cells, i.e., a state of charge (SOC) as being charged and discharged repeatedly. Upon charge and discharge for the high voltage battery, in light of tolerance of each the battery cell and safety, further charging is prohibited when unit cell with the highest electrode voltage reaches the predetermined upper limit voltage, and further discharging is prohibited when unit cell with the lowest electrode voltage reaches the predetermined lower limit voltage. Therefore, usable battery capacity is substantially reduced in such an abnormal state that the variation of the SOC of each the battery cell induces. It is required that the SOC for each the battery cell is averaged and returned in a normal state in such a way that the unit cell with the highest electrode voltage in the above-mentioned high voltage battery is thereby discharged besides via the above-mentioned electric motor drive. It is also required to monitor electrode voltage of each the unit cell so as to average the SOC of such the unit cells.

The above-mentioned high voltage battery also generates significant heart by discharge of high current when driving the above-mentioned electric motor, and if certain unit cells have defect, it may thereby become in such an abnormal state as to exceed an upper limit temperature, being thereby overheated. Therefore, in order to prevent the abnormal state by stopping discharge before being in such a high temperature abnormal state, it is required to monitor the temperature of the high voltage battery. Further, since the above-mentioned electrode voltage is varied as the battery temperature varies, the above-mentioned electrode voltage is also compensated in response to the temperature.

A high voltage battery system of a conventional battery state monitoring system is shown in FIG. 21.

This high voltage battery system shown as reference sign 801 in FIG. 21 has a high voltage battery 810 as a plurality of battery packs and a battery state monitoring device 850 that monitors a state of the high voltage battery 810.

The high voltage battery 810 has a battery module 820 including a plurality of battery cells aligned in one direction, a bus bar module 830 aligned stacked on the battery module 820, wire harness 840 including a connector plug 841 and a plurality of electric wires 842.

The bas bar module 830 is provided with a plurality of bas bars 831. The plurality of bus bar 831 all connects a plurality of the battery cells 821 by connecting positive electrodes and negative electrodes that are adjacent to each other. The bus bar module 830 is also provided with a plurality of temperature sensors 832 at a middle and both ends in one direction, i.e., a direction of the plurality of battery cells 821, outputting a voltage according to the detected temperature.

Each one end of the plurality of electric wires 842 of the wire harness 840 is connected to a not-shown terminal in the connector plug 841, and the other end of which is connected to each of a plurality of terminal fittings 833 and the temperature sensors 832, the plurality of terminal fittings 833 being connected to electrodes of the battery cells 821 such as stacked on the plurality of the bus bars 831.

The battery state monitoring device 850 is provided with, e.g., a box-shaped case 851 and a controller (not shown) composed of a microcomputer that is accommodated in the case 851. The case 851 is provided with a connector socket (not shown) brought into engagement with the connector plug 841 of the wire harness 840, exposed from the case 840. By engaging the connector socket with the connector plug 841, the controller and the ware harness 840, i.e., the abovementioned terminal fitting 833 and the temperature sensors 832 are connected.

The controller has thereby detected the temperature of the electrode voltage of the plurality of battery cells and the temperature of the battery cell according to the voltage outputted via the plurality of terminal fittings 833 and the temperature sensors 832, and monitored whether or not each of the high voltage batteries 810 is in a normal state.

CITATION LIST

Patent Literature

[PTL 1]
Japanese Patent Application Laid-Open Publication No. 2011-76,936

SUMMARY OF INVENTION

Technical Problem

However, with the above-mentioned high voltage battery system 801, there has been drawback that because the number of the plurality of electric wires 842 of the wire harness 840 is required in response to the number of the battery cells, and because the plurality of electric wires 842 is pulled out from the battery cell 821 to be led to the battery state monitoring device 850, a room for routing the wire harness 840 is more required, resulting in difficulty of design or workability for routing. While electrode voltage of the battery cell 821 enters into the battery state monitoring device 850 via the wire harness 840, this electrode voltage of the battery cell 821 may become high voltage such as several hundred volts by a potential different from a reference such as a car body, and design for safety and reliability such as insulation tolerance or noise tolerance has been thereby required in light of possible combination in the battery state monitoring device 850 of such high voltage, and the low voltage for control, resulting in difficulty of electrical design for such devices.

Accordingly, an object of the invention is to resolve the above-mentioned drawback. Namely, the invention is intended to provide a battery state notifying unit, a bus bar module, a battery pack, and a battery state monitoring system, allowing to reduce the number of electric wires led to a unit monitoring the battery state, and lower a signal voltage through the electric wire.

Solution to Problem

In order to attain the above-mentioned object, a first aspect of the present invention provides a battery state monitoring system comprising: (a) at least a battery pack having a plurality of battery cells, and a plurality of battery state output devices, each battery state output device outputting an analog signal data corresponding to a state of each of the plurality of the battery cells, each of the at least a battery pack having a battery state notifying unit including (i) an information generator generating a digital signal battery state data including information indicating the state of each of the plurality of battery cells in response to the analog signal data outputted via the battery state output device, and (ii) an information transmitter; and (b) a battery state monitoring unit monitoring the state of each of the plurality of the battery cells, wherein the information transmitter transmits the digital signal battery state data generated by the information generator to the battery state monitoring unit.

According to the first aspect of the invention, the information transmitter may be configured to transmit the digital signal battery state data to the battery state monitoring unit by serial communication.

The first aspect of the invention may further comprise; a common signal line brought into connection with the battery state monitoring unit, and the battery state notifying unit disposed in the at least a battery pack, wherein communication protocol of the information transmitter is multiplex communication protocol via the common signal line.

According to the first aspect of the invention, the at least a battery pack may be provided with a bus bar module having a plurality of bus bars connecting electrodes of the plurality of battery cells to each other, and the battery state notifying unit is disposed in the bus bar module.

According to the first aspect of the invention, the battery state monitoring unit may be attached to the at least a battery pack.

In order to attain the above-mentioned object, a second aspect of the invention provides a battery state notifying unit disposed in a battery pack having a plurality of battery cells, and a plurality of battery state output devices, each of the plurality of battery state output devices outputting an analog signal data corresponding to a state of each of the plurality of battery cells, comprising: an information generator generating a digital signal battery state data including information indicating the state of each of the plurality of battery cells corresponding to the analog signal data outputted via each of the plurality of battery state output devices; and an information transmitter transmitting the digital signal battery state data generated by the information generator to outside the battery pack.

The second aspect of the invention may provide a bus bar module disposed in a battery pack having a plurality of battery cells comprising:
a plurality of bus bars connecting electrodes of the plurality of battery cells to each other;
a plurality of battery state output devices, each battery state output device outputting an analog signal data corresponding to a state of each of the plurality of battery cells; and the battery state notifying unit as described in the second aspect of the invention.

The second aspect of the invention may provide a battery pack having a plurality of battery cells; a plurality of battery state output devices, each battery state output device outputting an analog signal data corresponding to a state of each of the plurality of battery cells; and the battery state notifying unit as described in the second aspect of the invention.

Advantageous Effects of Invention

According to the first aspect of the invention, since each of the battery state notifying unit is disposed in the battery pack, which the battery state notifying unit generates the digital signal battery state data composed of the state of the battery cells based on the analog data outputted according to the state of battery cells by the battery state output device of the battery pack, and transmits the battery state data to the battery state monitoring unit, it is made possible, in the battery state monitoring unit, to monitor the state of the battery pack according to the battery state data transmitted by the battery state notifying unit of the battery pack, and thereby to reduce the number of the plurality of electric wires of the wire harness adapted to connect the battery state notifying unit and the battery state monitoring unit to the number required for transmitting the above-mentioned digital signal battery state data. Accordingly, it is made possible to reduce the number of the plurality of electric wires of wire harness, and thereby to facilitate design for routing the wire harness and workability of routing. Since the above-mentioned digital signal battery state data is transmitted to the battery state monitoring unit, it is also made possible to lower voltage of the transmitting signal of such several volts. Therefore, it is made possible to facilitate electric design for safety and reliability such as insulation tolerance or noise tolerance of the battery state monitoring unit.

According to the first aspect of the invention, since the information transmitter may be configured to transmit the battery state data to the battery state monitoring unit by serial communication, it is made possible to more reduce the number of the plurality of electric wires of wire harness required for transmitting the above-mentioned battery state data than that by parallel communication, and thereby to more reduce the number of the plurality of electric wires of the wire harness, further facilitating design and workability for routing the wire harness.

According to the first aspect of the invention, since the common signal line connected to the battery monitoring unit and the battery state notifying unit disposed in the at least a battery pack may be disposed, and communication protocol for the information transmitter may be adapted for multi communication protocol using the common communication signal line, it is made possible to connect the battery state monitoring unit and the plurality of battery state notifying units of the battery pack through one set of common signal line if a plurality of battery packs are provided, to transmit the battery state data from each of the battery state notifying unit to the battery state notifying unit through the common signal line. Therefore, since it is not necessary to connect the battery state monitoring unit to each of the battery state notifying unit on one-on-one level, it is made possible to reduce the number of the plurality of electric wires of the wire harness, further facilitating design and workability for routing the wire harness.

According to the first aspect of the invention, since the battery pack may be provided with a bus bar module including a plurality of bus bars adapted to connect a plurality of battery cells to each other, and the battery state notifying unit may be disposed in the bus bar module, it is made possible to assemble the battery state notifying unit into the battery pack along with assembling of a plurality of battery cells into the bus bar module, to facilitate assembling workability of the battery pack. Further, since electric wire for connecting the battery state notifying unit and the battery state output device is not pulled out outside the battery pack, it is made possible to downsize the battery pack.

According to the first aspect of the invention, since the battery state monitoring unit may be attached to one of the battery pack, it is made possible to shorten the length of the wire harness for connecting the battery state monitoring unit and the battery pack, thereby to further facilitate design for routing the wire harness and workability of routing.

According to the second aspect of the invention, since each of the battery state notifying unit is disposed in the battery pack, which the battery state notifying unit generates the digital signal battery state data composed of the state of the battery cells based on the analog signal data outputted according to the state of battery cells by the battery state output device of the state of the battery pack, and transmits the battery state data to outside the battery pack, it is made possible, in an outer unit monitoring the state of the battery pack disposed other than the battery pack, to monitor the state of the battery pack according to the battery state data transmitted by the battery state notifying unit of the battery pack, and thereby to reduce the number of the plurality of electric wires of the wire harness adapted to connect the battery state notifying unit and the outer unit to the number required for transmitting the above-mentioned digital signal battery state data. Accordingly, it is made possible to reduce the number of the plurality of electric wires of wire harness, and thereby to facilitate design for routing the wire harness and workability of routing. Since the above-mentioned digital signal battery state data is transmitted to the outer unit, it is also made possible to lower voltage of the transmitting signal of about such several volts. Therefore, it is made possible to facilitate electric design for safety and reliability such as insulation tolerance or noise tolerance of the battery state monitoring unit.

According to the second aspect of the invention, since the above-mentioned battery state notifying unit may be disposed, it is made possible to reduce the number of the plurality of electric wires of wire harness, and thereby to facilitate electric design for safety and reliability such as insulation tolerance or noise tolerance of the battery state monitoring unit.

BRIEF DESCRIPTION OF DRAWINGS

FIG. 6 is a functional block diagram, where illustrated in (a) is the battery state notifying unit of FIG. 5, and illustrated in (b) is a modification for connection between a press-connecting terminal and a cell voltage input.

DESCRIPTION OF EMBODIMENTS

Subsequently, a battery power source system that is an embodiment of a battery power source system according to the present invention will be discussed with reference to FIGS. 1 to 20.

The battery system according to the present embodiment is mounted in a hybrid electric vehicle, to apply power to an electric motor. This battery power source system is provided with a battery pack composing a high voltage power source for operating the above-mentioned electric motor. Further the hybrid electric vehicle is provided with a low voltage battery composing a low voltage power source of about 12 volts for operating engine starter and vehicle electric devices.

Figure 1:
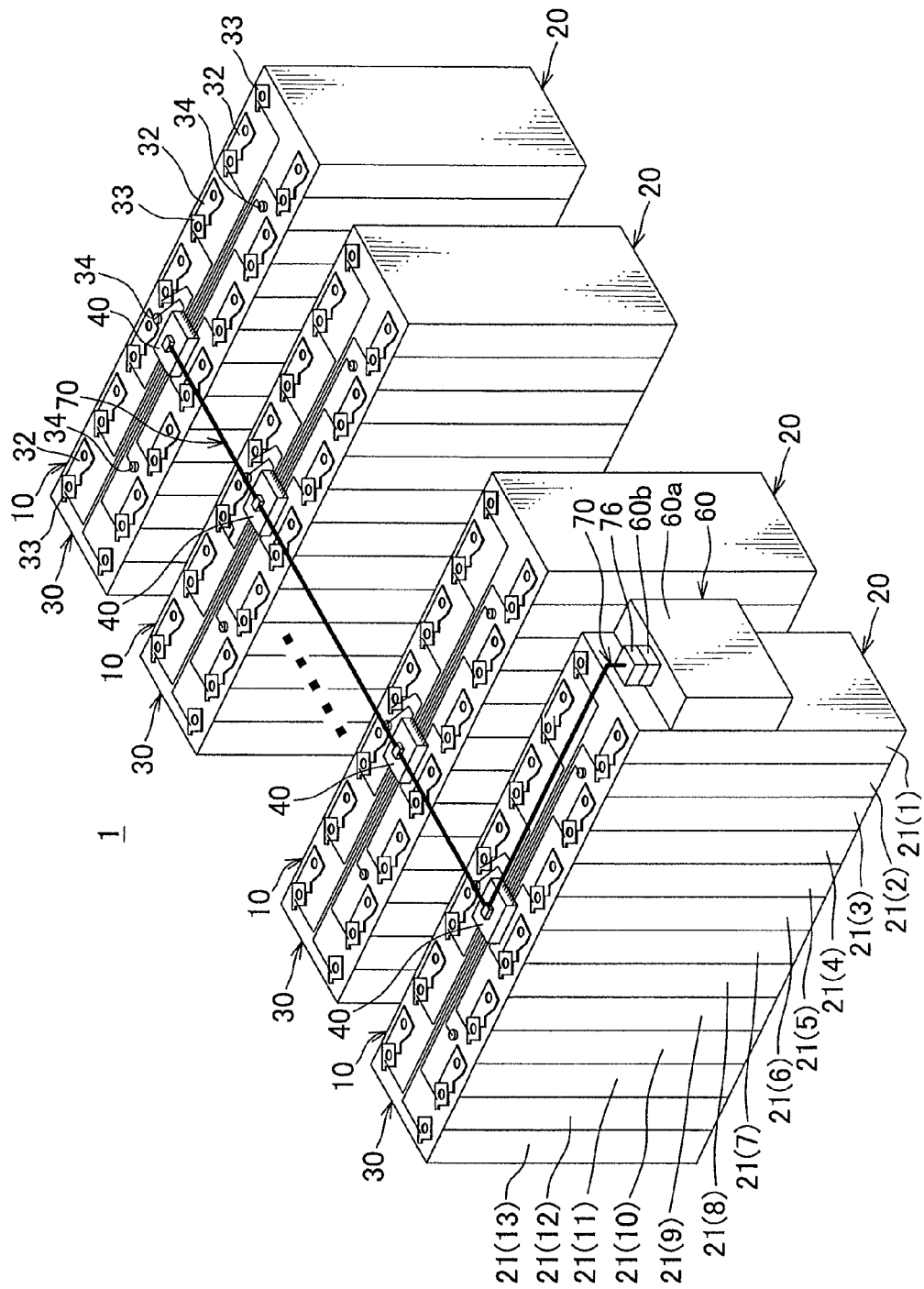
FIG. 1 is a perspective view illustrating a battery power source system of an embodiment of a battery state monitoring system according to the present invention.
Figure 2:
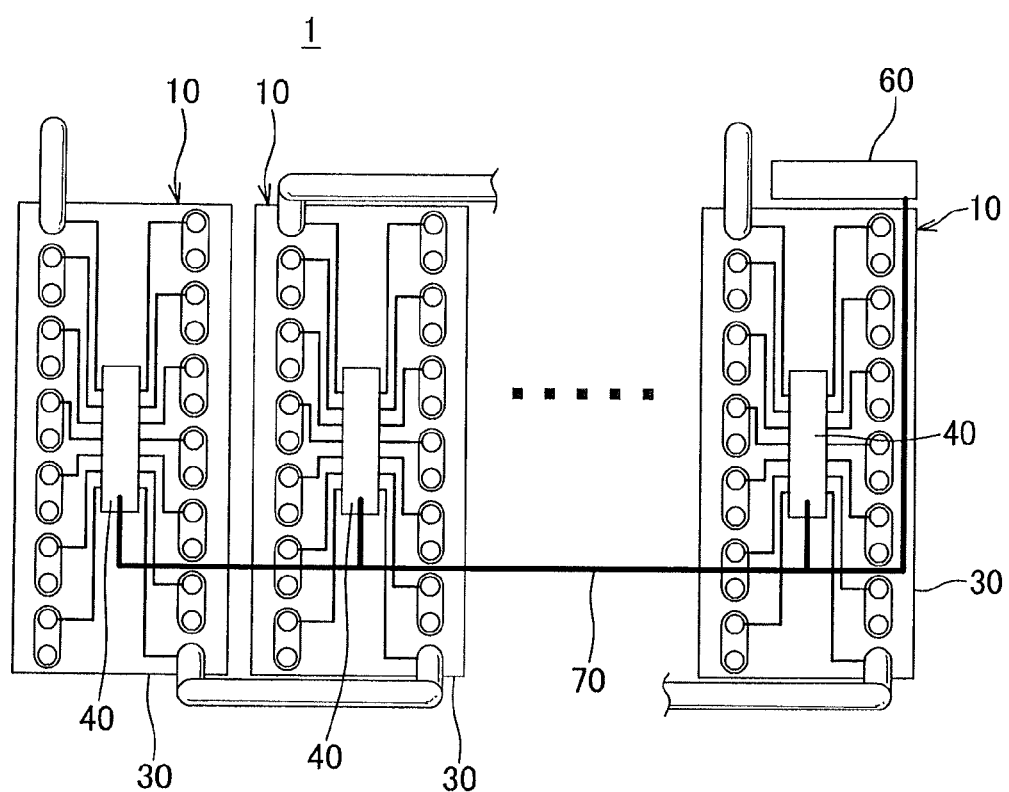
FIG. 2 is a top view of the battery power source system of FIG. 1.
Figure 3:
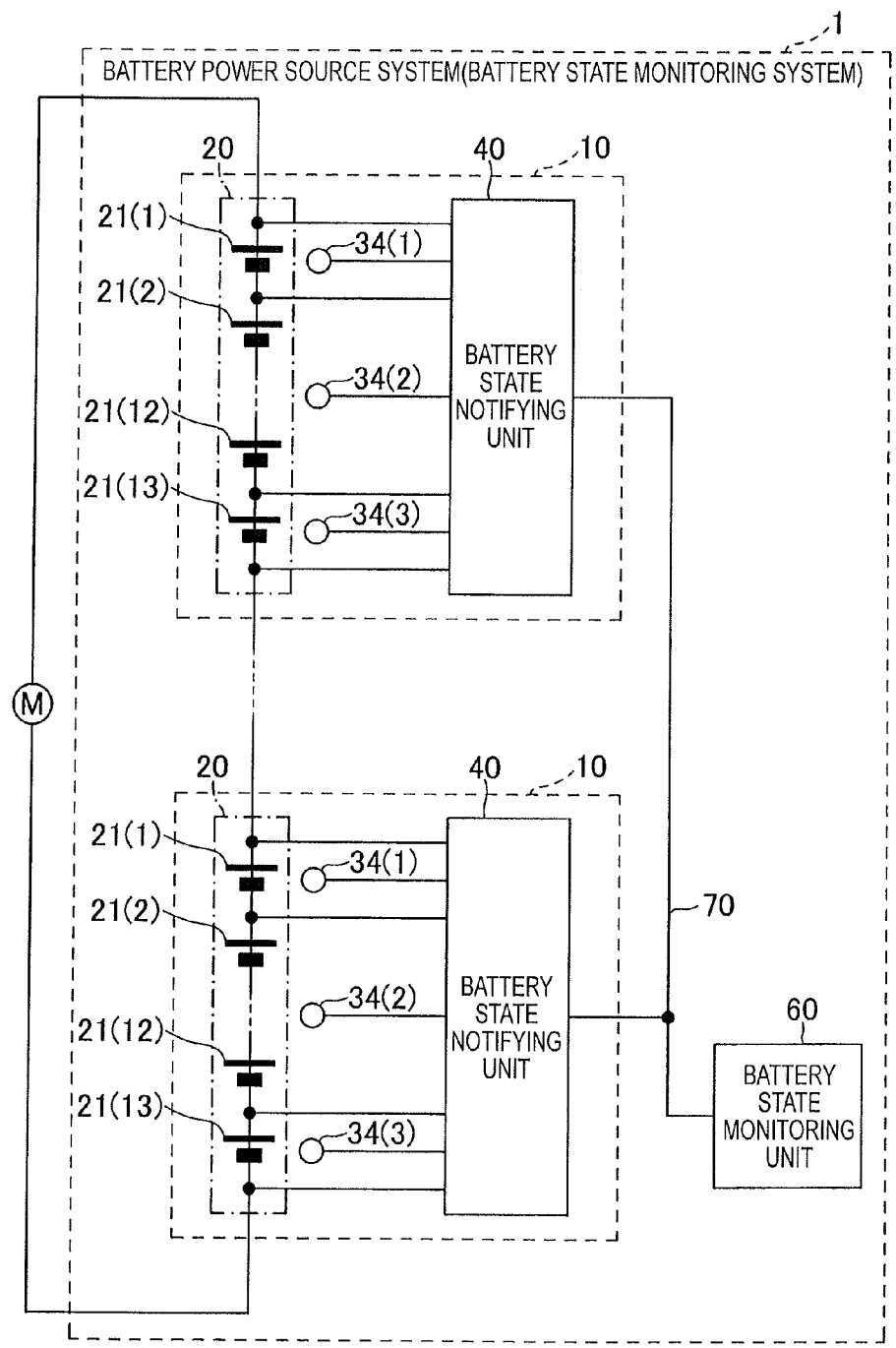
FIG. 3 is a functional block diagram of the battery power source system of FIG. 1.

The battery system (shown by reference sign 1 in the figure), as shown in FIGS. 1 to 3, includes a plurality of battery packs 10 as combined batteries, battery state monitoring unit 60, wire harness 70 connecting the plurality of battery packs 10 and the battery state monitoring unit 60. The plurality of battery packs 10 is connected in series to each other, and connected to an electric motor M.

Figure 4:
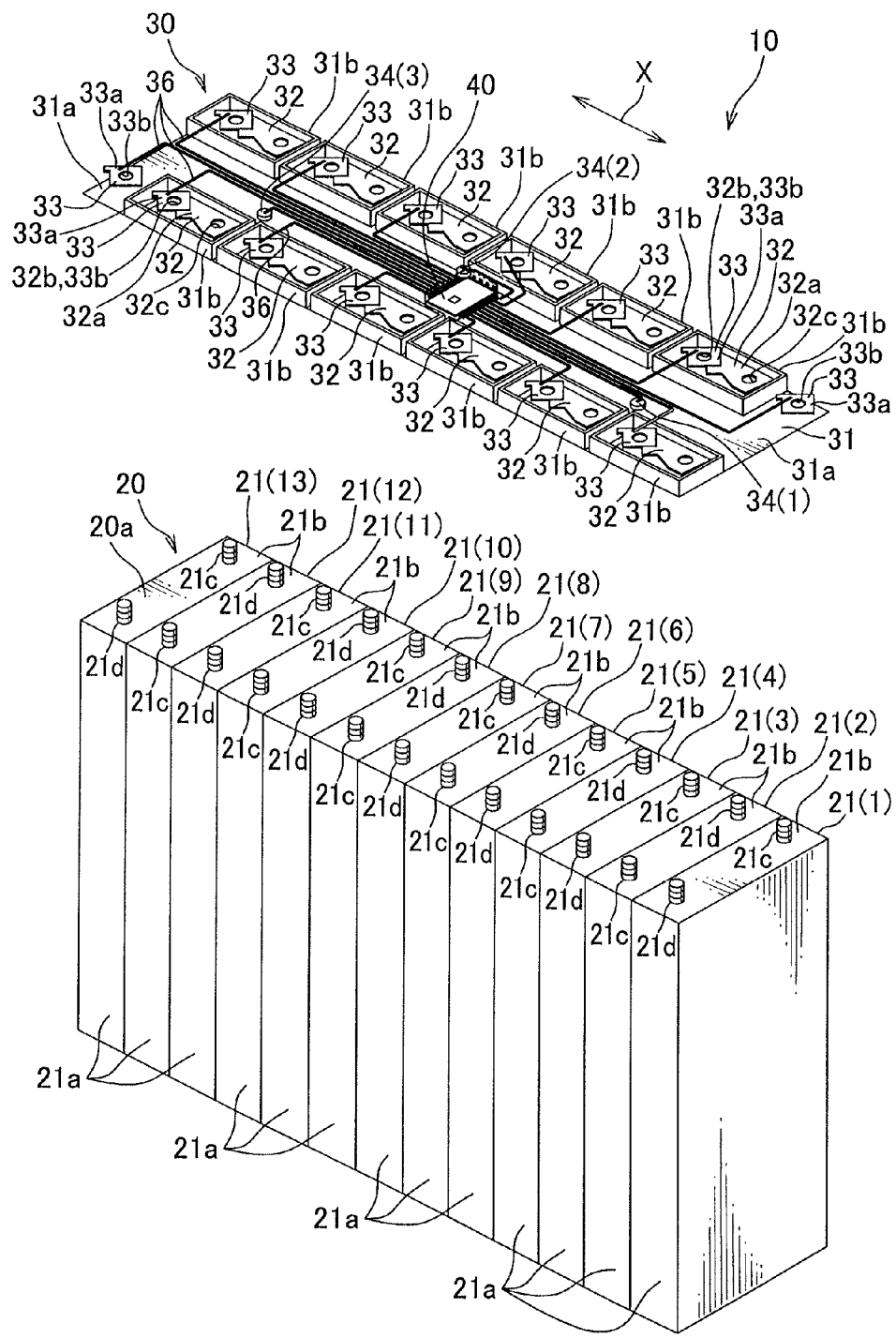
FIG. 4 is an exploded perspective view illustrating a battery pack included in the battery power source system of FIG. 1.

The battery packs 10, as shown in FIG. 4, includes a battery module 20 and a bus bar module 30.

The battery module 20 includes a plurality of battery cells 21 that are arranged in a line in one direction, a direction of an arrow X in FIG. 4, and fixed to each other. The plurality of battery cells in the present embodiment are composed of 13 cells (battery cells 21(1) to (13)).

The battery cells 20 are each provided with a box-shape battery main body 21a, a columnar pair of positive electrode 21c and negative electrode 21d formed of conductive metal, projecting from both ends of one face 21b of the battery main body 21a.

In the plurality of battery cells 21 the above-mentioned top face 21b of the battery main body 21a points in the same direction (up direction in FIG. 4), and the battery main body 21a of the adjacent battery cells 21 is arranged in contact with each other. The plurality of the battery 21 are arranged so that the positive electrode 21c of one of the battery cell 21 and the negative electrode 21d of the other battery cell 21 adjacent to the one of the battery cell 21 will lie to each other (i.e., along a direction of the arrow X in such an order as a positive electrode 21c, a negative electrode 21d, a positive electrode 21c, a negative electrode 21d . . . ) The plurality of battery cells 21 is fixed to each other with not-shown binder in such a manner as to keep the above-mentioned arrangement. The battery module 20 is nearly box-shaped in which a plurality of battery cells 21 is continuous to each other.

The bus bar module 30, as shown in FIG. 4, includes a case 31, a plurality of bus bars 32, a plurality of terminal fittings 33, and a plurality of temperature sensor 34, and the battery notifying unit 40.

The case 31 is formed of insulating synthetic resin in nearly plate shape. A planer view of the case 31 is formed oblong nearly the same face of the battery module 20 (hereinafter, referred to as "electrode face 20a") continuous to the one of face 21b of each the battery cell 21. On the other face (hereinafter, referred to as "upper face 31a") of the case 31, a plurality of box 31b formed open upward adapted to accommodate a plurality of bus bars 32 to be mentioned below, is arranged in two lines in a longitudinal direction of the case 31. The case 31 is attached to the battery module 20 such that the other face opposite to the upside 31a is closely stacked on the above-mentioned electrode face 20a of the battery module 20. Bottom faces of the plurality of boxes 31b are provided with through bores corresponding to the positive electrode 20c and the negative electrode 21d of the above-mentioned electrode face 20a such that the positive electrode 20c and the negative electrode 21d of the above-mentioned electrode face 20a project within the box 31b.

Each of the plurality of bus bars 32 includes a bus bar main body 32a made of conductive oblong metal plate, both ends of which are provided with a pair of bus bar through bores 32b, 32c. The number of the plurality of bus bars 32 in this embodiment is twelve. The bus bar 32 is formed in such a manner that a pair of bus bar through bores 32b, 32c is overlapped with the through bore of the bottom face of the box 31b. This pair of bus bar through bores 32b, 32c makes the positive electrode 21c and the negative electrode 21d of the battery cells 21 adjacent to each other passed through, and thereby the bus bars 32 connect these battery cells in series.

The plurality of terminal fittings 33 include a fitting main body 33a made of nearly square conductive metal plate, a middle of which is provided with a fitting through bore 33b. The number of the plurality of terminal fittings 33 in the present embodiment, is fourteen. Certain terminal fittings 33 are located on the upper face 31a of the case 31 such that the positive electrode 21c of the battery cell 21(1) arranged at an end of the battery module 20, and the negative electrode 21d of the battery cell 21(13) arranged at the other end of the battery module 20 make the fitting through bores 33b passed therethrough. The others of the certain terminal fittings 33 are located within the box 31b stacked on the bas bar 32 such that the positive electrodes 21c of the battery cells 21(2) to 21(12) make the fitting through bores 33b passed therethough. The plurality of terminal fittings 33 is each connected to a battery state notifying unit 40 to be mentioned below with lead wires 36 composed of a covered electric wire. The terminal fitting 33 corresponds to a battery state output device in the claims. An electrodes voltage between the positive electrode 21c and negative electrode 21d of the battery cell 21 that is observed, i.e., outputted, via the terminal fitting 33 also corresponds to an analog signal data in the claims.

A plurality of temperature sensors 34 is provided with, e.g., a thermistor, and is configured to output a voltage corresponding to a measured temperature. In the present embodiment, a plurality of temperature sensors 34 is disposed at both ends of the longitudinal direction of the case 31 and a middle thereof, totaling three temperature sensors, 34(1) to 34(3).

Each of these temperature sensors 34 (1) to 34(3) is positioned in accordance with the battery cells 21(3), 21(7), and 21(11). The plurality of temperature sensors 34 is located to abut the electrode face 20a of the battery module 20, and thereby outputs a voltage corresponding to the electrode face 20a, i.e., the battery cells 21(3), 21(7), (11). Each of the plurality of temperature sensors 34 is connected to a battery state notifying unit 40 to be mentioned below with lead wires 36 composed of a covered electric wire. The temperature sensor 34 corresponds to the battery state output device in the claims. A voltage of the temperature sensor 34 outputs also corresponds to the analog signal data in the claims. Note that, in order to correspond to every battery cells 21(1) to 21(13), the temperature sensors 34 may total thirteen temperature sensors, 34(1) to 34(13).

Figure 5:
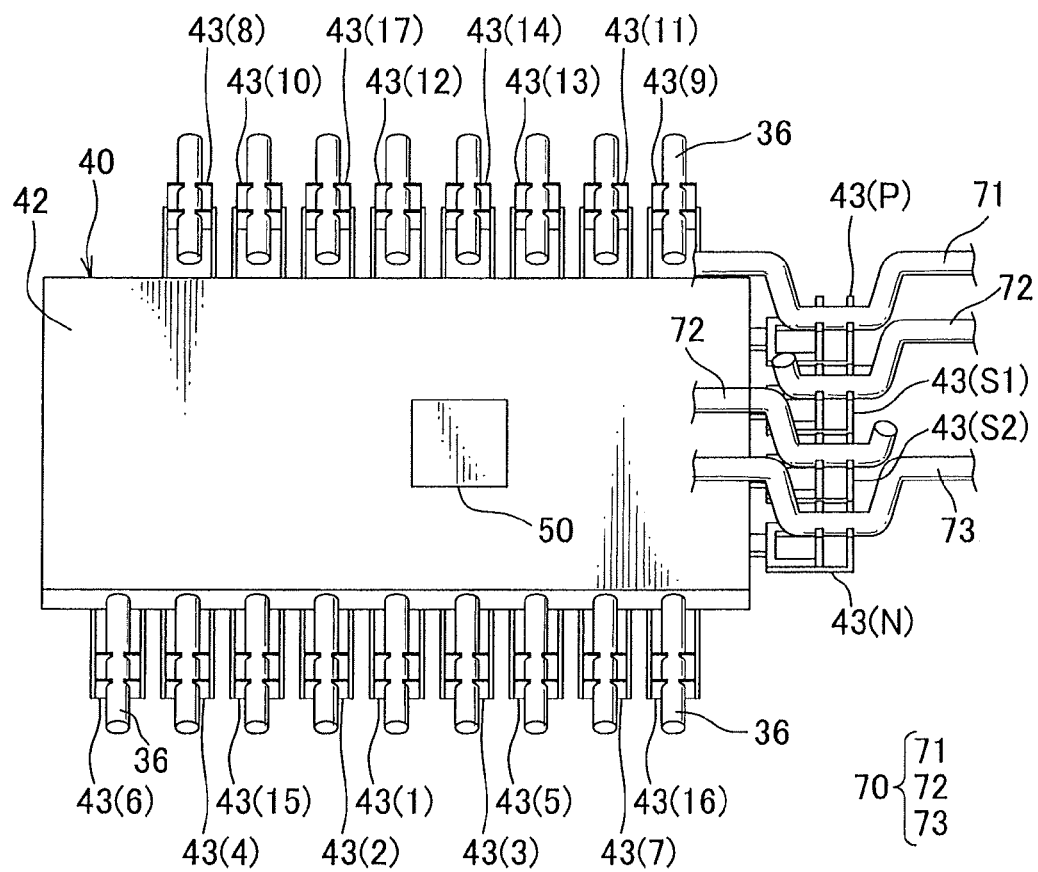
FIG. 5 is a perspective view illustrating a battery state notifying unit included in the battery pack of FIG. 4.

The state notifying unit 40 as shown in FIG. 5 includes a unit board 42 and a plurality of press-connecting terminals 43.

The unit board 42 is one that various electric components such as microcomputer 50 (hereinafter referred to as ".mu. COM50") are mounted on a known printed circuit board (PCB). Note that electric components other than .mu. COM50 are omitted in FIG. 5. On circumferential edges of the unit board 42 a plurality of press-connecting terminal 43 is disposed. In the present embodiment, the number of the plurality of press-connecting terminals 43 is arranged twenty one (the press-connecting terminals 43(1) to 43(17), press-connecting terminal 43(P), (S1), (S2), (N)). The plurality of press-connecting terminals 43 is connected to the lead wires 36 connected to the above-mentioned fitting 33 or the above-mentioned temperature sensor 34, and a wire harness to be mentioned below.

Each of the press-connecting terminals 43(1) to 43(13) is connected to the positive electrode 21c of the battery cells 21(1) to 21(13) via the terminal fittings 33 and the lead wires 36. The positive electrode 21c of the battery cells 21 is connected to the negative electrode 21d of the other battery cell 21 adjacent to the concerned battery cell 21, and thereby each of the press-connecting terminals 43(2) to 43(13) is connected to the negative electrodes 21d as well via the terminal fittings 33 and the lead wires 36. The press-connecting terminal 43(14) is connected to the negative electrode 21*d* via the terminal fitting 33 and the lead wire 36.

The press-connecting terminal 43(15) is connected to the temperature sensor 34(1) arranged near one end of the case 31 (right side in FIG. 4). The press-connecting terminal 43(16) is connected to the temperature sensor 34(2) arranged at the middle of the case 31. The press-connecting terminal 43(17) is connected to the temperature sensor 34(3) arranged near the other end of the case 31 (left side in FIG. 4).

The press-connecting terminal 43(P) is connected to a power source line 71 included in the wire harness 70. This press-connecting terminal 43(P) is connected to power source line wiring pattern, i.e., power-supply voltage Vcc, on the unit board 42. The press-connecting terminal 43(N) is also connected to a ground line included in the wire harness 70. This press-connecting terminal 43(N) is connected to a ground wiring pattern, i.e., ground GND, on the unit board 42. The press-connecting terminals 43(S1), (S2) are connected to common signal lines 72 included in the wire harness 70. These press-connecting terminals 43(S1), (S2) are connected to a communication module 55 to be mentioned below.

The battery state notifying unit 40 is arranged on the upper face 31*a* of the case 31. Further, the battery state notifying unit 40 is preferably arranged at a middle in a longitudinal direction of the case 31. Such arrangement of the battery state notifying unit 40 thus allows to reduce length difference between the lead wires 36, i.e., difference between the longest lead wire and the shortest lead wire 36 brought into connection with the plurality of terminal fittings 33 and the press-connecting terminals 43(1) to (14).

A function block diagram of the battery state notifying unit 40 is shown in FIG. 6A. The battery state notifying unit 40 as shown in FIG. 6A, includes the above-mentioned plurality of press-connecting terminals 43, a cell voltage input 45, a temperature signal input 46, a first analog-digital converter or ADC 47, a second ADC 48, the µCOM50, and the communication module 55. The battery state notifying unit 40 is supplied with the above-mentioned low voltage power source to operate via the wire harness 70, being powered by the low voltage power source. And the cell voltage input 45, the temperature signal input 46, the first ADC 47, the second ADC 48, the µCOM50, and the communication module 55 may be configured to be packed in one IC package.

The cell voltage input 45 includes a plurality of input terminals PI1 to PI14, a output terminal PO, a switch control terminal C, and a known multiplexer (not shown) outputting a signal from the output terminal PO in response to a voltage inputted to the input terminals PI1 to PI14 according to a connection switch control signal 1 inputted to the switch control terminal C.

In the cell voltage input 45 a battery module 20, i.e., a plurality of battery cells 21 outputting a electrode voltage, i.e., high voltage analog signal, of tens of volts in response to remaining amount of the battery cell 21, is connected to each of the input terminal PI, and on the other hand, the first ADC 47 operative with low voltage of several volts is connected to the output terminal PO. There is thus disposed a known flying capacitor (not shown, e.g., see Japanese Patent Application Laid-Open Publication No. 11-248,755, or Japanese Patent Application Laid-Open Publication No. 2006-337,130) to separate these high voltage parts, i.e., the above-mentioned high voltage power source, and the low voltage part, i.e., the above-mentioned low voltage power source, and transform a high voltage analog signal to a low voltage analog signal so as to enter into the first ADC 47 operatively.

The input PI1 of the cell voltage input 45 is connected to the press-connecting terminal 43(1) via a current limit resistor R1. Namely, the input PI1 is connected to the positive electrode 21*c* of the battery cell 21(1). The input terminal PI2 is connected to the press-connecting terminal 43(2) via the current limit resistor R2. Namely, the input PI2 is connected to the negative electrode 21*d* of the battery cell 21(1) and the positive electrode 21*c* of the battery cell 21(2). Subsequently the inputs PI3 to PI13 are, in the same manner, each connected the negative electrodes 21*d* of the battery cells 21(2) to (12), and the positive electrodes 21*c* of the battery cells 21(3) to (13), via each of the current limit resistor R3 to R13. The input PI14 is also connected to the negative electrode 21*d* of the battery cell 21(13) of the battery cell 21(13) via the current limit resistor R14.

That is, an electrode voltage of the positive electrode 21*c* and the negative electrode 21*d* of the battery cell 21(1) between the input PI1 and PI2 is inputted into the cell voltage input 45. Likewise, between the inputs PI2 and PI3 an electrode voltage of the battery cell 21(2) is inputted, and subsequently, to the inputs PI3 to PI 14 electrode voltages between the battery cells 21(3) to (13) are inputted, respectively. Then the cell voltage input 45 transforms the electrode voltages between the battery cells 21 inputted to these input terminals PI to the low voltage analog signal, "cell voltage signal" by the flying capacitor circuit, and outputs the above-mentioned cell voltage signal corresponding to the battery cell 21 designated by the µCOM50 to the output terminal PO.

Each of the input terminals PI1 to PI14 is also connected to discharge switches SW1 to SW13 brought into shortening adjacent input terminals PI to each other. In particular, the discharge switch SW1 is disposed between the input terminal PI1 and PI2, the discharge switch SW2 is disposed between the input PI2 and PI3, and likewise the discharge switches SW3 to SW13 are disposed between input terminals PI3 to PI14, respectively.

Each of the discharge switches SW1 to SW13 is switched independently by a control signal via the µCOM50. In particular, when the discharge switch SW1 is in closed state, a closed loop is formed in a sequence of the positive electrode 21*c* of the battery cell 21(1), the current limit resistor R1, the discharge switch SW1, the current limit resistor R2, the negative electrode 21*d* of the battery cell 21(1), to discharge the battery cell 21(1). This makes the electrode voltage of the battery cell 21(1) reduced. The other discharge switches SW2 to SW13 are configured to correspond to the battery cells 21(2) to (13), closing the discharge switches makes, in the same manner as mentioned above, the voltages between the electrodes of the battery cells 21(2) to (13) reduced respectively. The discharge switches SW1 to SW13 are typically in open state, and are made closed when necessary to discharge the battery cell 21.

The above-mentioned embodiment is configured as shown in FIG. 6(*a*), but not limited thereto, such that the press-connecting terminals are connected to each of the input terminals PI1 to PI14 of the battery input terminals 45 via the current limit resistors R1 to R14. In the other such configuration as shown in FIG. 6B, e.g., the press-connecting terminals 43(1), (2) may be directly connected to the input terminals PI1, PI2 of the cell voltage input 45, and the discharge switch SW1 and the current limit resistor R1 directly connected thereto may be disposed between the input terminal PI1 and the input terminal PI2. Likewise, the other input terminals PI1 to PI14 are directly connected to the press-connecting terminals 43(3) to (14), and the other discharge switches SW2 to SW13 and the current limit resistors R2 to R13 are configured to be disposed between the input terminals. Such configuration makes the number of the current limit resistors 13 (R1 to R13)reduced, i.e., reducing the current limit resistors by one. Respective direct connection of the press-connecting terminals 43 and the input terminals PI can reduce voltage drop by the current limit resistor, improving detection accuracy for the electrode voltage of the battery cells 21, which enables to accurately detect the electrode voltage, especially when the discharge switch SW is in closed state.

The temperature signal input 46 includes a plurality of input terminals QI1 to QI13, one output terminal QO, a switch control terminal C, a known multiplexer circuit (not shown) that outputs the temperature signal inputted to the input terminals QI1 to QI13 to the output terminal QO in response to the connection switch control signal 2 that is inputted to the switch control terminal C.

The input terminal QI1 of the temperature signal input 46 is connected to the press-connecting terminal 43(15). Namely, the input terminal QI1 is connected to the temperature sensor 34(1). The input terminals QI2, QI3 are connected to the temperature sensors 43(16), 43(17) respectively. Namely, the input terminals QI2 ,QI3 are connected to the temperature sensors 34(2), (3) respectively.

In the temperature signal input 46, a voltage, corresponding to the measured temperature to be outputted by the temperature sensors 34(1) to (3), i.e., an analog signal data, is inputted to the input terminals QI1 to QI3, the input terminal QI designated by the connection switch control signal 2 via the μCOM50 is connected to the output terminal QO, and the voltage of the concerned input terminal QI is outputted from the output terminal QO as "cell temperature signal".

The first ADC 47 and the second ADC 48 are known analog-digital converter circuits. The first ADC 47, when the cell voltage signal outputted from the cell voltage input 45 is inputted, quantizes the cell voltage signal to transform into digital, and outputs the corresponding cell voltage signal transformed into digital. The second ADC 48, when the cell temperate signal outputted from the temperature signal input 46 is inputted, quantizes the cell temperature signal to transform into digital, and outputs the corresponding temperature voltage signal transformed into digital.

The microcomputer 50 is central processing unit (CPU) 51 executing a variety of processing or controls according to predetermined program, a dedicated read only memory ROM 52 processing program or a variety of information for the CPU 51 is stored, a rewritable memory RAM 53 having an area required for storing a variety of information and processing operation for the CPU 51, and a not-shown external interface. The ROM 52 stores processing programs to operate the CPU 51 as various means for information generator. The CPU 51 is served as the above-mentioned various means through executing processing programs.

The external interface is connected to the first ADC 47 and the second ADC 48. The external interface transmits the cell voltage signal and the cell temperature signal respectively inputted from the first ADC 47 and the second ADC 48 to the CPU 51. The interface is also connected to the communication module 55.

The communication module 55 is configured to communicate using LIN protocol (Local Interconnect Network) that is known protocol for serial multi communication protocol. The communication module 55 is located between the μCOM 50 and the press-connecting terminals 43(S1), (S2). The communication module 55 is connected to the common signal line 72 of the wire harness 70 via the press-connecting terminal 43(S1), (S2).

The communication module 55 communicates with a battery state monitoring unit 60 also connected to the common signal line 72 to be mentioned below using LIN protocol. The communication module 55 outputs a variety of information such as commands transmitted from the battery state monitoring unit 60 via the common signal line 72 to the g COM 50, and also outputs the variety of information such the battery state information transmitted from the μCOM 50 to the battery state monitoring unit 60 via the common signal line 72. The communication module 55 corresponds to information transmitter in the claims.

Figure 7:
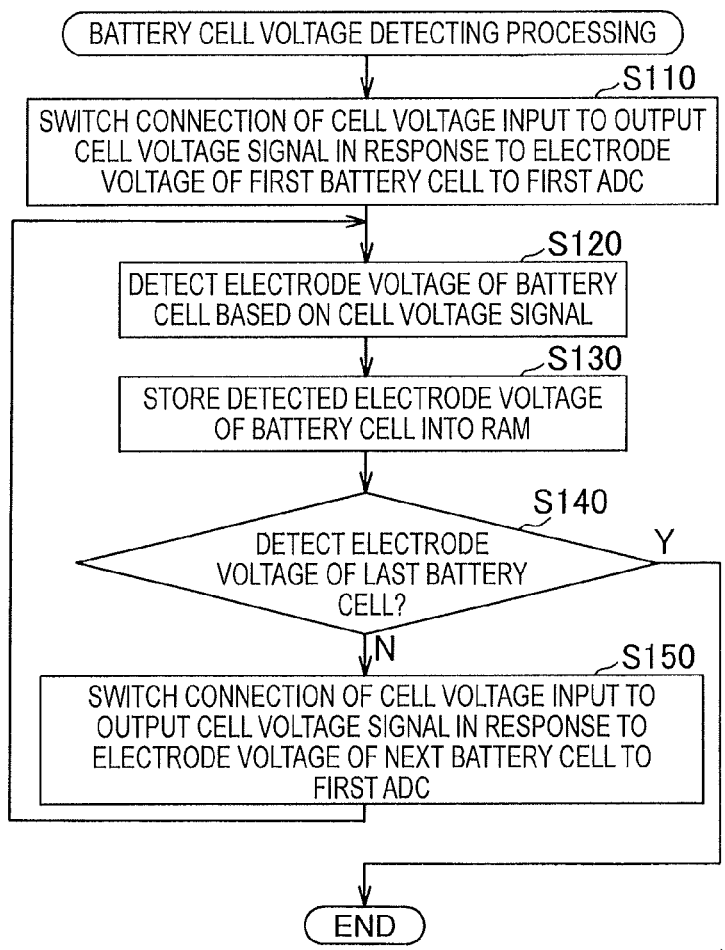
FIG. 7 is a flowchart illustrating an example for a battery cell voltage detect processing to be executed by a microprocessor (CPU) of the battery state notifying unit of FIG. 6A.

Then, one example operation according to the present invention of the above-mentioned battery state notifying unit 40 will be discussed with reference to FIGS. 7 to 9.

The battery state notifying unit 40, i.e., the CPU 51 of the μCOM 50, executes in parallel a battery cell voltage detecting processing (FIG. 7), a battery cell temperature detecting processing (FIG. 8), and a battery state information transmission processing (FIG. 9) respectively.

The CPU 51 executes the battery cell voltage detecting processing (FIG. 7) at predetermined intervals. The CPU 51 first switches connection of the cell voltage input 45 such that the cell voltage signal corresponding to the electrode voltage of the first battery cell 21(1) can be outputted to the first ADC (S110).

In particular, the CPU 51 transmits the connection switch control signal 1 to the cell voltage output 45 so that the electrode voltage 21(1) inputted to the input terminals PI1, PI2 of the cell voltage input 45 can be transformed into the cell voltage signal by the flying capacitor circuit, and that the above-mentioned cell voltage signal corresponding to the battery cell voltage 21(1) can be outputted from the output terminal PO. This makes the cell voltage signal corresponding to the battery cell 21(1) inputted into the first ADC 47. In the first ADC 47, the concerned cell voltage signal is then quantized to be transformed into digital, and which the corresponding cell voltage signal transformed into digital is inputted into the CPU 51 via the external interface.

Then, the CPU 51 detects the electrode voltage 21(1) in response to the cell voltage signal inputted from the first ADC 47 (S120). The detected voltage between the battery cells 21(1) is then stored into the area Vi corresponding to the battery cell 21(1) of the electrode voltage stored areas V1 to V13 (shown in FIG. 10) provided in every battery cells 21 in the RAM 53 (S130).

Subsequently, the CPU 51, until detecting the electrode voltage of the last 13th battery cell 21(13) (N in S140) , switches in sequential connection of the cell voltage input 45 (S150) in the same way as mentioned above so that the cell voltage signal corresponding to the electrode voltage of the battery cells 21(2) to (13) can be outputted to the first ADC 47, detects the electrode voltage of the battery cells 21(2) to (13) corresponding to the cell voltage signal inputted from the first ADC 47 (S120), and then stores the detected electrode voltage of the battery cells 21(2) to (13) into the electrode voltage stored areas V2 to V13 in the RAM 53 (S130) . And then after detecting the last 13th battery cell 21(13), the CPU 51 terminates the battery cell voltage detecting processing (Y in S140). Every time this battery cell voltage detecting processing is executed, the electrode voltage of the battery cells 21 stored in the electrode voltage stored areas Vi to V13 is updated.

Figure 8:
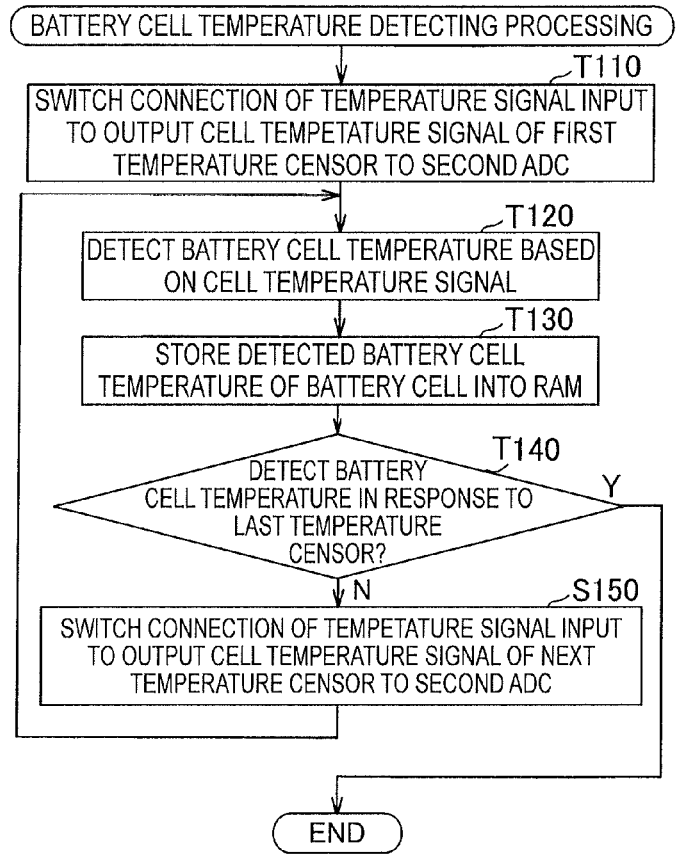
FIG. 8 is a flowchart illustrating an example for a battery cell temperature detect processing to be executed by a microprocessor (CPU) of the battery state notifying unit of FIG. 6A.

The CPU 51 also executes at predetermined intervals the battery cell temperature detecting processing (FIG. 8). The CPU 51 first switches connection of the temperature signal input 46 such that the cell temperature signal outputted from the first temperature sensor 34(1) can be outputted to the second ADC 48 (T110).

In particular, the CPU 51 transmits the connection switch control signal 2 to the temperature signal input 46 so that the cell temperature signal inputted to the input terminal QI1 of the temperature signal input 46 can be outputted from the output terminal QO. This makes the cell temperature signal of the temperature sensor 34(1) inputted into the second ADC 48. In the second ADC 48, the concerned cell temperature signal is then quantized to be transformed into digital, and which the corresponding cell temperature signal transformed into digital is inputted into the CPU 51 via the external interface.

Then, the CPU 51 detects a temperature of the battery cell 21 in response to the cell temperature signal inputted from the first ADC 48 (T120). The detected temperature of the battery cell 21(1) is then stored into the area T1 corresponding to the battery cell 21(3) of the temperature stored areas T1 to T3 provided in every battery cells 21(3), (7), and (11) in the RAM 53 (T130).

Subsequently, the CPU 51, until detecting the temperature of the battery cells 21(7), (11), switches in sequential connection of the temperature input 46 (T150) in the same way as mentioned above so that the cell temperature signal outputted from the temperature sensor 34(2), (3) can be outputted to the second ADC 48, detects the temperature of the battery cells 21(7), (11) inputted from the second ADC 48 (T120), and then stores the detected temperature of the battery cells 21(7), (11) into the temperature stored areas T1 to T3 in the RAM 53 (T130). And then after detecting the last 3rd battery cell 21(11), the CPU 51 terminates the battery cell temperature detecting processing (Y in T140). Every time this battery cell temperature detecting processing is executed, the temperature of the battery cells 21 stored in the temperature stored areas T1 to T3 is updated.

Figure 9:
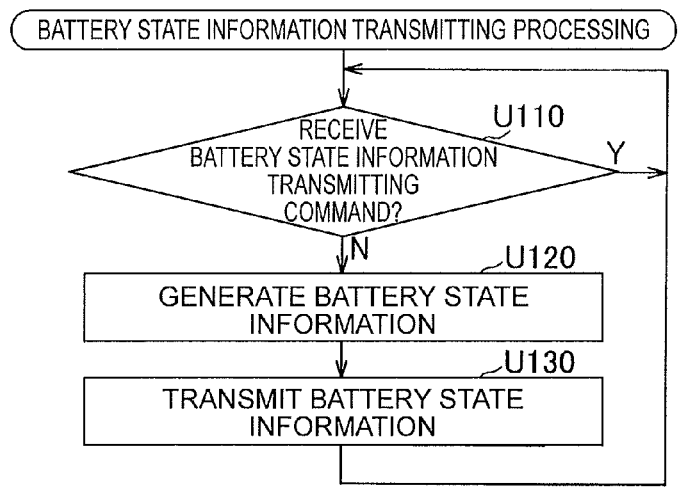
FIG. 9 is a flowchart illustrating an example for a battery state information transmission processing to be executed by a microprocessor (CPU) of the battery state notifying unit of FIG. 6A.
Figure 10:
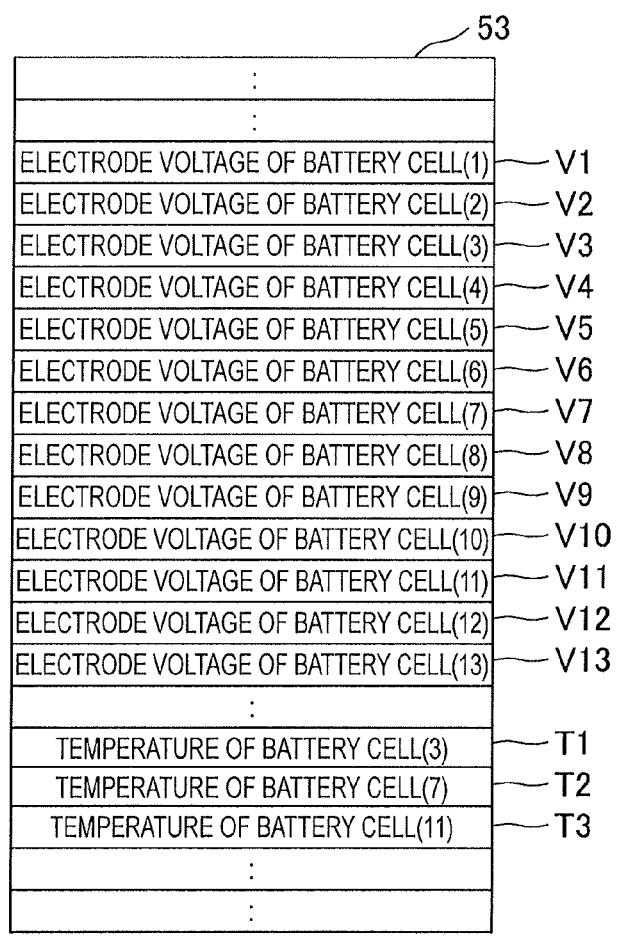
FIG. 10 is a view illustrating an electrode voltage stored area and a temperature stored area disposed in RAM of the microprocessor of the battery state notifying unit of FIG. 6A.

The CPU 51 executes the battery state data transmitting processing (FIG. 9). The CPU 51 waits until receiving predetermined battery state data transmitting command from the battery state monitoring unit 60 via the communication module 55 (N in U110). And when receiving the concerned battery state data transmitting command (Y in U110), the CPU 51 reads the electrode voltage of each of the battery cell 21 from the electrode voltage stored areas V1 to V13, and reads the temperature of each of the battery cell 21 from the temperature stored areas T1 to T3, then generates the battery state data including these electrode voltages and temperatures (U120). The battery state data generated herein is represented as digital signal. Namely, the CPU 51 corresponds to information generator in the claims. And the generated state data is transmitted to the battery state monitoring unit 60 (U130) via the communication module 55. Subsequently, the above-mentioned processing will be repeated.

Further, the CPU 51 executes a battery discharge processing, alongside the above-mentioned processing. The CPU 51 waits until receiving predetermined battery cell discharging command from the battery state monitoring unit 60 via the communication module 55. This battery cell discharge command includes cell designation information indicating the battery cell 21 targeted for discharge. When receiving the concerned battery discharge command, the CPU 51 transmits a control signal to the discharge switch SW so that the discharge switch SW corresponding to the battery cell 21 indicated by the cell designation information including the concerned command can be closed during predetermined time before turned open. This makes the battery cell 21 designated by the battery cell discharge command discharged.

In the present embodiment the battery cell voltage detecting processing (FIG. 7), the battery cell temperature detecting processing (FIG. 8), and the battery state data transmitting processing (FIG. 9) are executed in parallel, respectively, but not limited to this embodiment. For example, without executing at intervals the battery call voltage detecting processing along with the battery cell temperature detecting processing independently, these may be executed in the battery state data transmitting processing. In particular, in the battery state data transmitting processing, just after receiving the battery state data transmitting command, executing the battery call voltage detecting processing along with the battery cell temperature detecting processing, the CPU 51 may update the battery electrode voltage and the temperature of the battery cell, then may generate the battery state data.

The battery state monitoring unit 60 includes a box-shaped unit case 60a as shown in FIG. 1, in which a printed circuit board (not shown) populating various electric components is accommodated. One face of the unit case 60a is provided with a connector socket 60b that is exposed, brought into connection to a connector plug 76 of the wire harness 70. In the present embodiment, the battery state monitoring unit 60 is fastened to the battery module 20 of one battery pack 10 of the plurality of battery packs.

Figure 11:
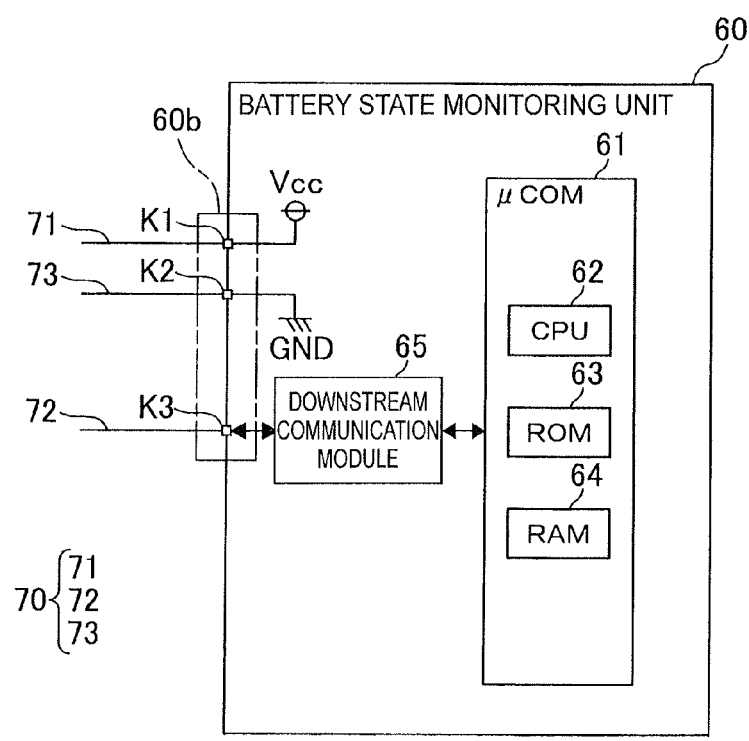
FIG. 11 is a functional block diagram illustrating the battery state monitoring unit included in the battery power source system of FIG. 1.

FIG. 11 shows a function block diagram of the battery state monitoring unit 60. As shown in FIG. 11, the battery state monitoring unit 60 includes a microcomputer 61 (hereinafter referred to as "μCOM 61"), a downstream communication module 65. The battery state monitoring unit 60 operates, being supplied with power from low voltage power supply. Namely, a power supply wired pattern on the printed circuit board of the battery state monitoring unit 60, i.e., power source voltage Vcc, and a ground wired pattern, i.e., a ground GND, are connected to the low voltage power source.

The μCOM 61 includes a central processing unit (CPU) 62 executing a variety of processing or controls according to predetermined programs, a dedicated read only memory ROM 63 processing programs or a variety of information for the CPU 62 are stored into, a rewritable memory RAM 64 having an area required for storing a variety of information and processing operation for the CPU 62, and a not-shown external interface. In the ROM 63 processing programs operating the CPU 62 as various means for information generator are stored. The CPU 62 is served as the above-mentioned various means by executing the processing programs. And the external interface is connected to the downstream communication module 65.

The downstream communication module 65 is configured to communicate using LIN protocol (Local Interconnect Network) that is the above-mentioned serial multi communication protocol. The downstream communication module 65 is arranged between the μCOM 61 and a terminal K2 of the connector socket 60b. The downstream communication module 65 is connected to the common signal line 72 of the wire harness 70 via the terminal K3.

The downstream communication module 65 communicates using LIN protocol via the above-mentioned common signal line 72 with the plurality of battery state notifying units 40 connected to the common signal line 72. The downstream communication module 65 outputs a variety of information such as the battery state data transmitted from the battery state notifying unit 40 via the common signal line 72 to the μCOM 61, and also outputs the variety of information such as the command transmitted from the μCOM 61 to the battery state notifying unit 40 via the common signal line 72.

The external interface is connected to a not-shown upstream communication module. This upstream communication module is configured to communicate using protocol such as known CAN protocol (Controller Area Network), to transmit or receive the variety of information using electric control devices mounted in the vehicle.

Then, one operation of the above-mentioned battery state monitoring unit 60 according to the present invention will be discussed.

In order to monitor the plurality of battery packs 10, the battery state monitoring unit 60, i.e., CPU 62 of the μCOM 61, transmits at predetermined intervals the above-mentioned battery state data transmitting command via the downstream communication module 65 to one of the battery state notifying unit 40 of the battery state notifying units 40 included in these plurality of battery packs.

When receiving the battery state data from the battery state notifying unit 40 that transmits the battery state information transmitting command, the CPU 62 determines whether or not the battery cell 21 that is required to discharge exists based on the electrode voltage or the temperature of the battery cell 21 included in the concerned battery state data. And when determining presence of the battery cell 21 required for discharge, the CPU 62 then transmits a battery cell discharge command including cell designating information indicating the battery cell 21 targeted for discharge to the battery state notifying unit 40 that transmits the battery state data. Subsequently, the same processing as mentioned above is sequentially executed for the other battery state notifying units 40 included in battery packs.

The wire harness includes the plurality of power source lines 71, the common signal line 72, the ground line 73, and a connector plug 76.

The power source lines 71, the common signal line 72, the ground line 73 are each connected to the terminal fittings of the connector plug 76. And when the connector plug 76 is engaged with the connector socket 60*b* of the battery state monitoring unit 60*b*, these power source lines 71, the common signal line 72, the ground line 73 are connected to terminals K1, K2, and K3 of the connector socket 60*b* via the terminal fittings.

The power source line 71 is connected to the power source wired pattern, i.e., power source voltage Vcc, on the printed wiring board of the battery state monitoring unit 60 via the terminal K1. The power source line 71 is connected to the press-connecting terminal 43(P) of each of the battery state notifying units 40.

Further, the ground line 73 is connected to the ground wired pattern, i.e., ground GND, on the printed wiring board of the battery state monitoring unit 60 via the terminal K3. The ground line 73 is connected to the press-connecting terminal 43 (N) of each of the battery state notifying units 40.

Then, the power source wired pattern and ground wired pattern of the battery state monitoring unit 60 is supplied with power from not-shown low voltage power source, and thereby each of the battery state notifying units 40 is supplied with power via the power source line 71 and the ground line 73.

The common signal line 72 is connected to the downstream communication unit 65 of the battery state monitoring unit 60 via the terminal K3. The common signal line 72 is connected on the bus to each of the communication modules 55 via the press-connecting terminals 43(S1), (S2) of each of the battery state notifying units 40.

Figure 12:
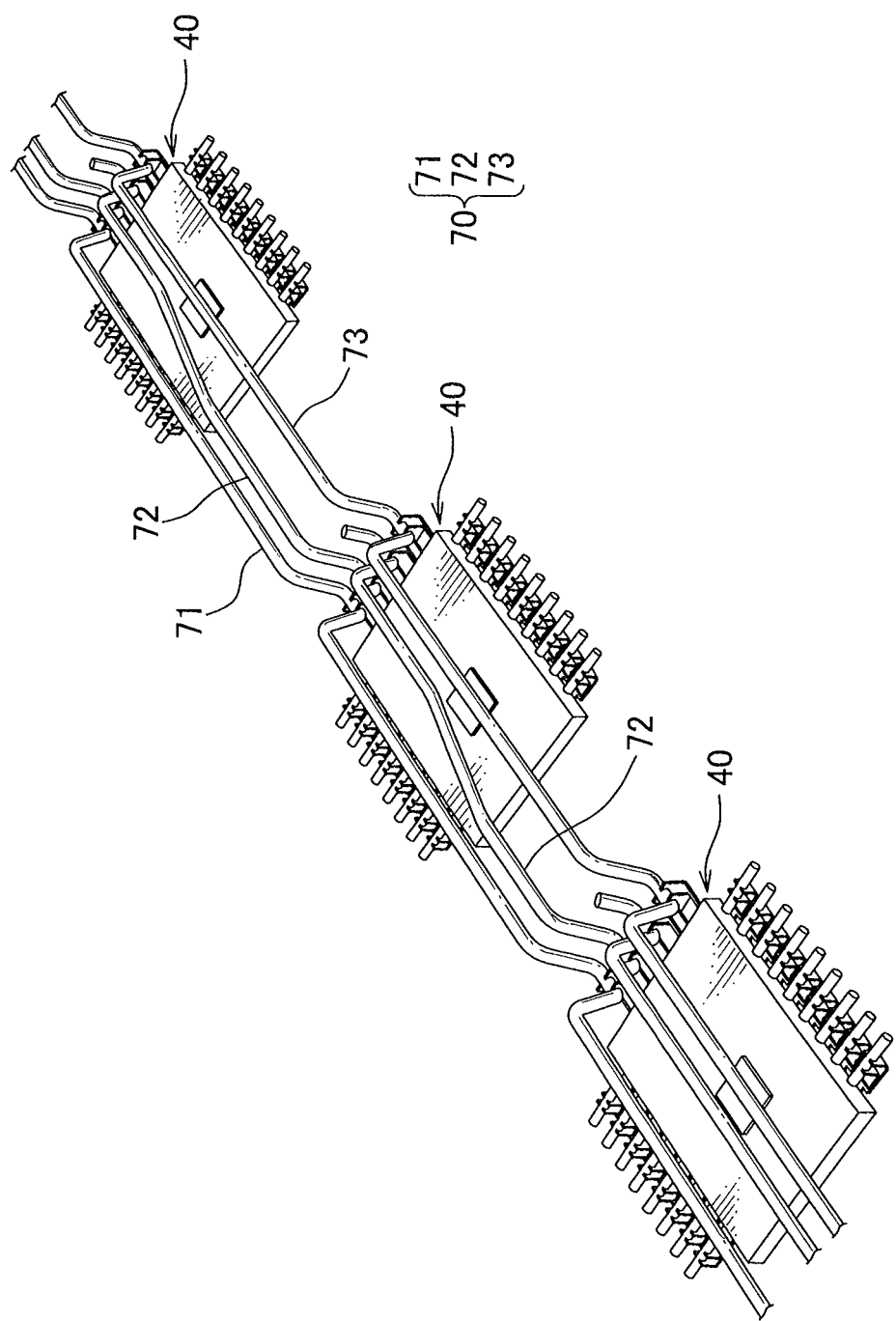
FIG. 12 is a perspective view illustrating an example configuration for connection of the battery state notifying unit and a wire harness of FIG. 5.

In the present embodiment, the plurality of battery state notifying unit 40 is, as shown in FIG. 12, connected to each other via the wire harness 70. The common signal line 72 is logically one, but one line is physically cut at every interval between the battery state monitoring unit 60 and the plurality of battery state notifying units 40. Of course, the common signal line 71 may be located physically as one line without being cut.

Figure 13:
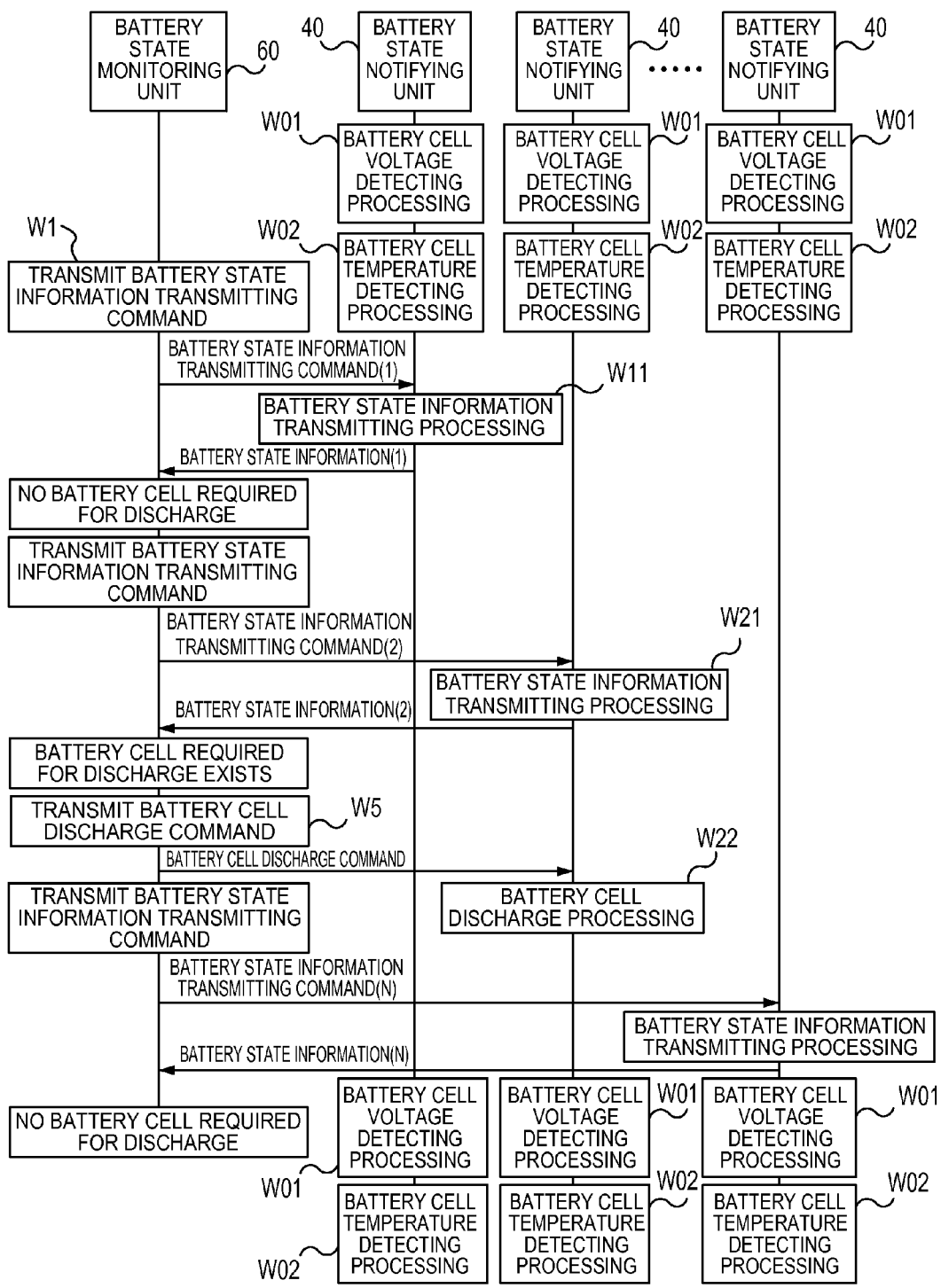
FIG. 13 is a sequence diagram illustrating an example for operation of the battery power source system of FIG. 1.

Then, one example operation of the above-mentioned battery power source system 1 will be discussed with reference to FIG. 13.

The battery state notifying units 40 (the battery state notifying units (1) to (N)) disposed in the above-mentioned battery pack 10 execute at predetermined intervals above-mentioned the battery cell voltage detecting processing and the battery cell temperature detecting processing, to store the electrode voltage and the temperature of the battery cell 21 into the RAM 53 (W01, W02).

The battery state monitoring unit 60 transmits the battery state data transmitting command (1) to the battery state notifying unit 40 (battery state notifying unit (1)) of one of the battery pack 10 of the plurality of battery packs 10 (W1). The battery state notifying unit (1) when receiving the battery state data transmitting command (1), executes the battery state data transmitting processing, and transmits the battery state data (1) to the battery state monitoring unit 60 (W11). The battery state monitoring unit 60, if determining that no battery cell requires discharge based on the battery state data (1), then goes to the next processing.

Then, the battery state monitoring unit 60 transmits the battery state data transmitting command (2) to the battery state notifying unit 40 (the battery state notifying unit (2)) of the other battery pack 10 of the plurality of battery packs 10 (W3). The battery state notifying unit (2) when receiving the battery state data transmitting command (2), executes the battery state data transmitting processing, and transmits the battery state data (2) to the battery state monitoring unit 60 (W21). The battery state monitoring unit 60, if determining based on the battery state data (2) that any battery cell requires discharge, then transmits the battery cell discharge command including the cell designation information indicating the battery cell targeted for discharge to the battery state notifying unit (2), then go to the next processing (W5). The battery state notifying unit (2) receiving this battery cell discharge command executes the battery cell discharge processing (W22).

Subsequently, the battery state monitoring unit 60, likewise, obtains the battery state data of all the battery packs from the battery state notifying unit 40, determining if the battery cell is required for discharge based on this battery state data, and then makes the battery state notifying unit 40, if necessary, discharge the battery cell.

According to the present embodiment, since each of the battery state notifying units 40 is disposed in the battery packs 10, which the battery state notifying unit 40 generates the battery state data composed of the digital signal including the state of the battery cells 21 based on the cell voltage signal outputted from the terminal fitting 33 of the battery pack 10 and the cell temperature signal outputted from the temperature sensor 34, and transmits the concerned battery state data to the battery state monitoring unit 60, it is made possible in the battery state monitoring unit 60, to monitor the state of the battery pack 10 according to the battery state data transmitted by the battery state notifying unit 40 of the battery pack 10, and thereby to reduce the number of the plurality of electric wires of the wire harness 70 adapted to connect the battery state notifying unit 40 and the battery state monitoring unit 60 to the required number for transmitting the above-mentioned battery state data of digital signal. Accordingly, it is made possible to reduce the number of the plurality of electric wires of wire harness 70, and thereby to facilitate design and workability for routing the wire harness. Since the above-mentioned battery state data of digital signal is transmitted to the battery state monitoring unit 60, it is also made possible to lower voltage of the transmitting signal of such several volts. Therefore, it is made possible to facilitate electric design for safety and reliability such as insulation tolerance or noise tolerance of the battery state monitoring unit 60.

Further, since the information module 55 of the battery state notifying unit 40 is configured to transmit the battery state data to the battery state monitoring unit 60 by serial communication, it is made possible to more reduce the number of the plurality of electric wires of wire harness 70 required for transmitting the above-mentioned battery state data than that by parallel communication, and thereby to more reduce the number of the plurality of electric wires of the wire harness 70, further facilitating design and workability for routing the wire harness.

Since the common signal line 72 is disposed to connect the battery monitoring unit 60 and the battery state notifying unit 40 that is disposed in the plurality of battery packs 10, and communication protocol for the information module 55 is adapted for multi communication protocol using the common communication signal line, it is made possible, when a plurality of battery packs 10 are provided, to connect the battery state monitoring unit 60 and the plurality of battery state notifying units 40 of the battery pack 10 through one set of common signal line, to transmit the battery state data from each of the battery state notifying units 40 to the battery state monitoring unit 60 through the common signal line 72. Therefore, since it is unnecessary to connect the battery state monitoring unit 60 to each of the battery state notifying units 40 on one-one level, it is made possible to reduce the number of the plurality of electric wires of the wire harness 70, further facilitating design and workability for routing the wire harness.

Figure 21:
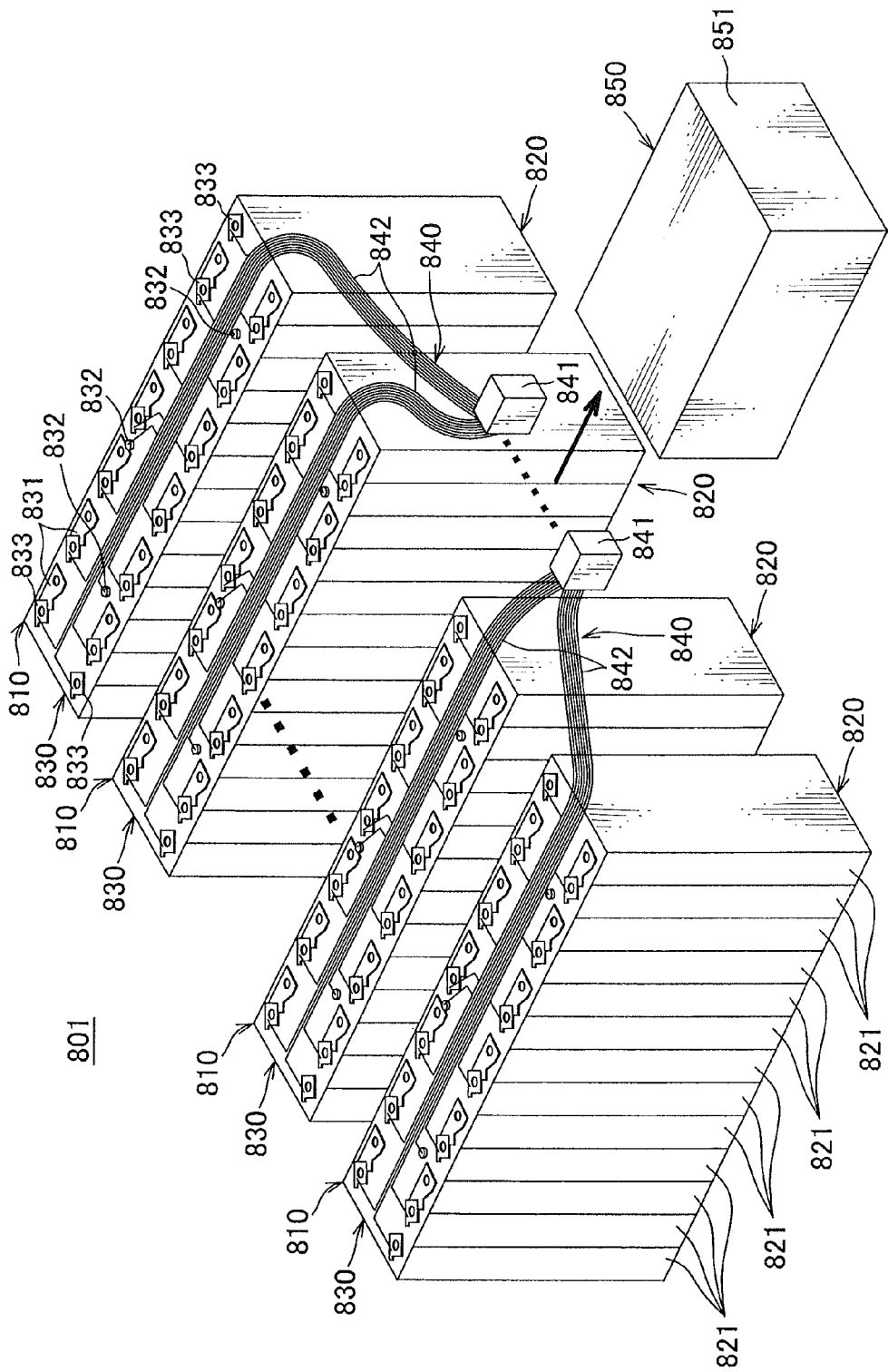
FIG. 21 is a perspective view illustrating a conventional high voltage battery system.

Since the battery pack 10 is provided with a bus bar module 30 including a plurality of bus bars 32 adapted to connect the positive electrodes 21c and the negative electrodes 21d of the plurality of battery cells 21 to each other, and the battery state notifying unit 40 is disposed in the bus bar module 30, it is made possible to assemble the battery state notifying unit 40 into the battery pack 10 along with assembling the plurality of battery cells 21 into the bus bar module 30, to facilitate assembling work of the battery pack 10. Further, since the lead wire 36 for connecting the battery state notifying unit 40 and the terminal fitting 33 and the temperature sensor 34 is not pulled out outside the battery pack 10 such as the wire harness in the conventional configuration as illustrated in FIG. 21, it is made possible to avoid routing design of the lead wire 36 outside the battery pack 10, and to downsize the battery pack 10.

Since the battery state monitoring unit 60 is attached to one of the battery pack 10, it is made possible to shorten the length of the wire harness for connecting the battery state monitoring unit 60 and the battery pack 10, to further facilitate design and workability for routing the wire harness 70.

Furthermore, since when each of the plurality of battery packs 10 is configured such that the number of the battery packs 21 is different from each other, these different configurations are absorbed by the battery notifying unit 40, it is made possible to standardize interface of the battery pack 10.

Figure 14:
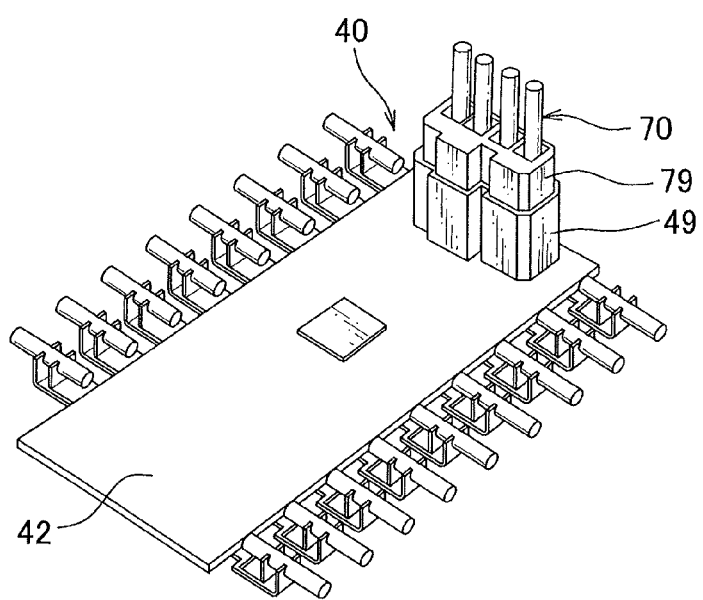
FIG. 14 is a perspective view illustrating a modification of the battery state notifying unit that connection of the wire harness in the battery state notifying unit of FIG. 5 is different.
Figure 15:
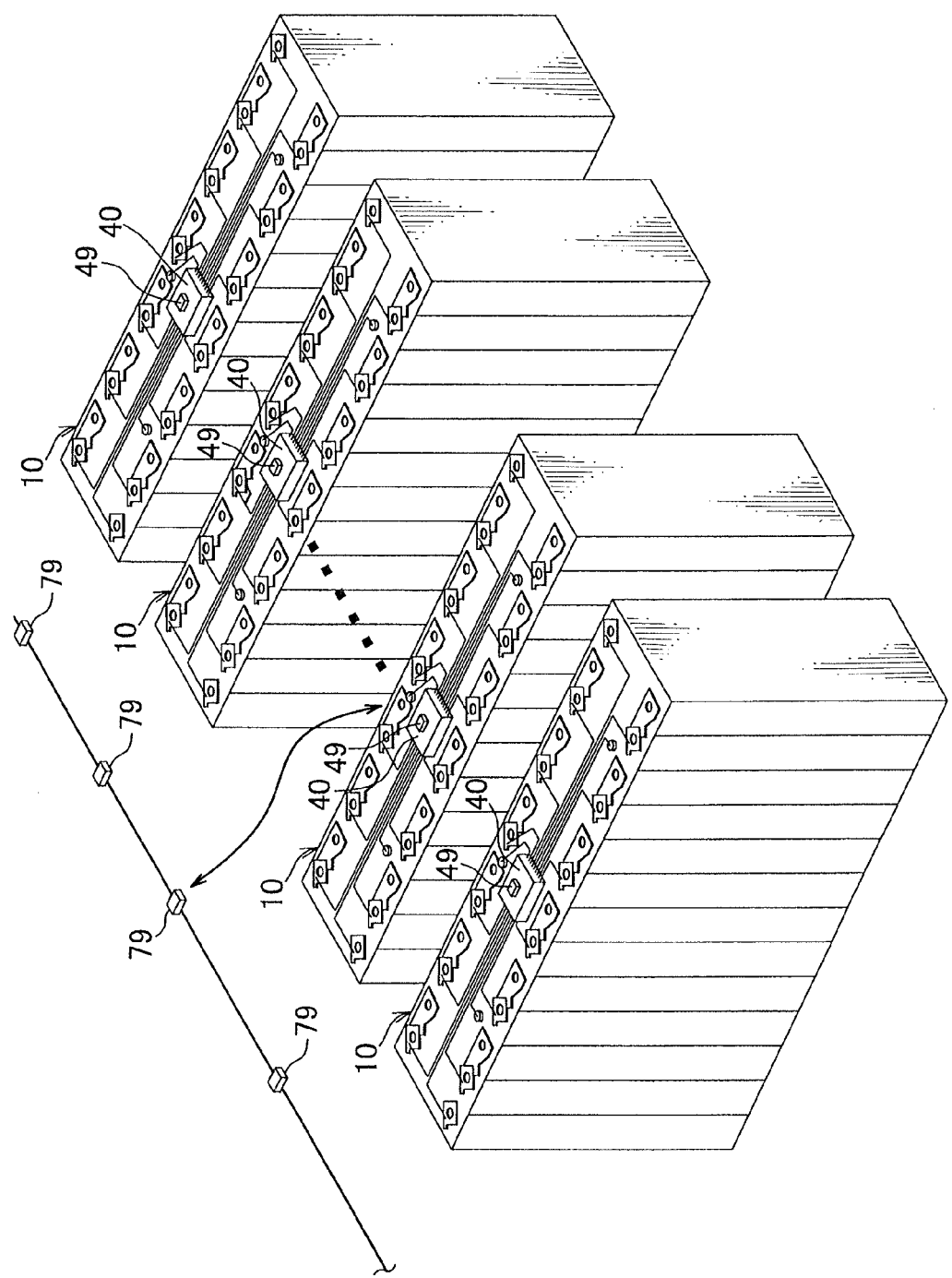
FIG. 15 is a perspective view illustrating a battery power source system including a battery state notifying unit of FIG. 14.

While in the above-mentioned present embodiment the wire harness 70 and the battery state notifying unit 40 are connected via the press-connecting terminals 43(P), (S1), (S2) and (N), but not limited to this embodiment, a pair of connector 79 and 49 engaging with each other, as shown in FIG. 14, 15, instead of the press-connecting terminal 43, may be provided with the wire harness 70 and the battery state notifying unit 40 so as to connect to each other with the pair of connectors 79, 49.

In this configuration the above-mentioned function of the battery state notifying unit 40 may be installed in the connector 79 of the wire harness 70.

Figure 16:
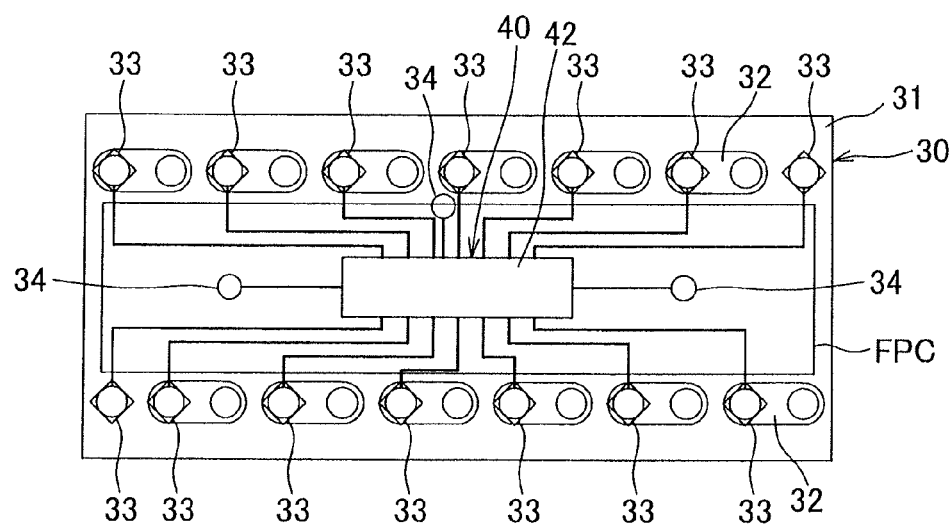
FIG. 16 is a top view illustrating a modification of a bus bar module including a battery pack of FIG. 4.
Figure 17:
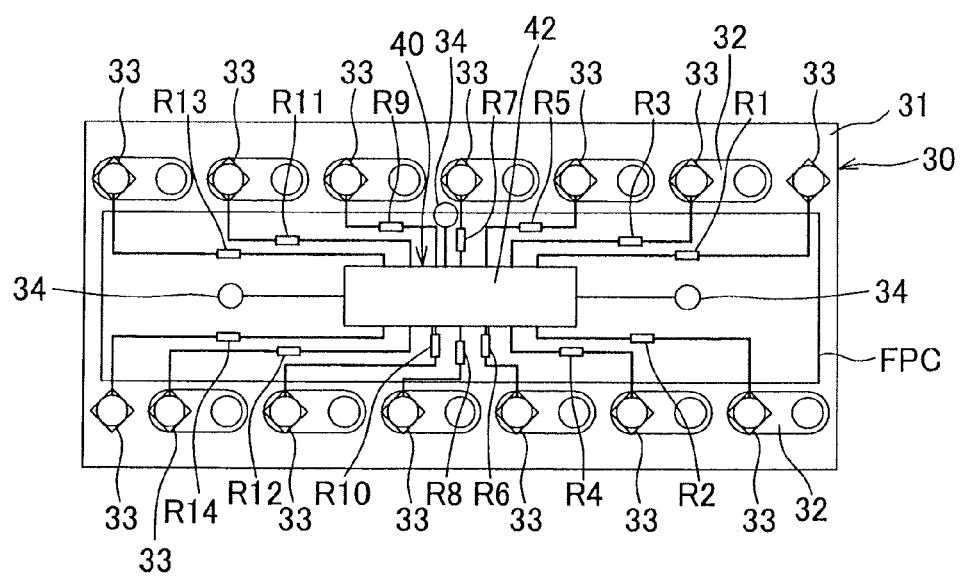
FIG. 17 is a top view illustrating other modification of a bus bar module including a battery pack of FIG. 4.

In the present embodiment, the terminal fittings 33, the temperature sensor 34, and the battery state notifying unit 40 are connected to each other using the lead wire 36, but not limited to this embodiment. For example, in the battery state notifying unit 40 as shown in FIG. 16, the unit board configured using PCB and a known flexible print circuit (FPC) are integrated into a rigid flexible board, and then with the FPC instead of the lead wire 36, the terminal fittings 33, the temperature sensor 34, and the battery state notifying unit 40 may be connected to each other. Alternatively, the unit board 42 may be configured to use the FPC. Further, with such configuration as to connect the terminal fittings 34, the temperature sensor 34, and the battery state notifying unit 40, the current limit resistor R1 to R14 of the battery state notifying unit 40 may be positioned on the FPC. Such configuration makes the unit board 42 downsized.

Figure 18:
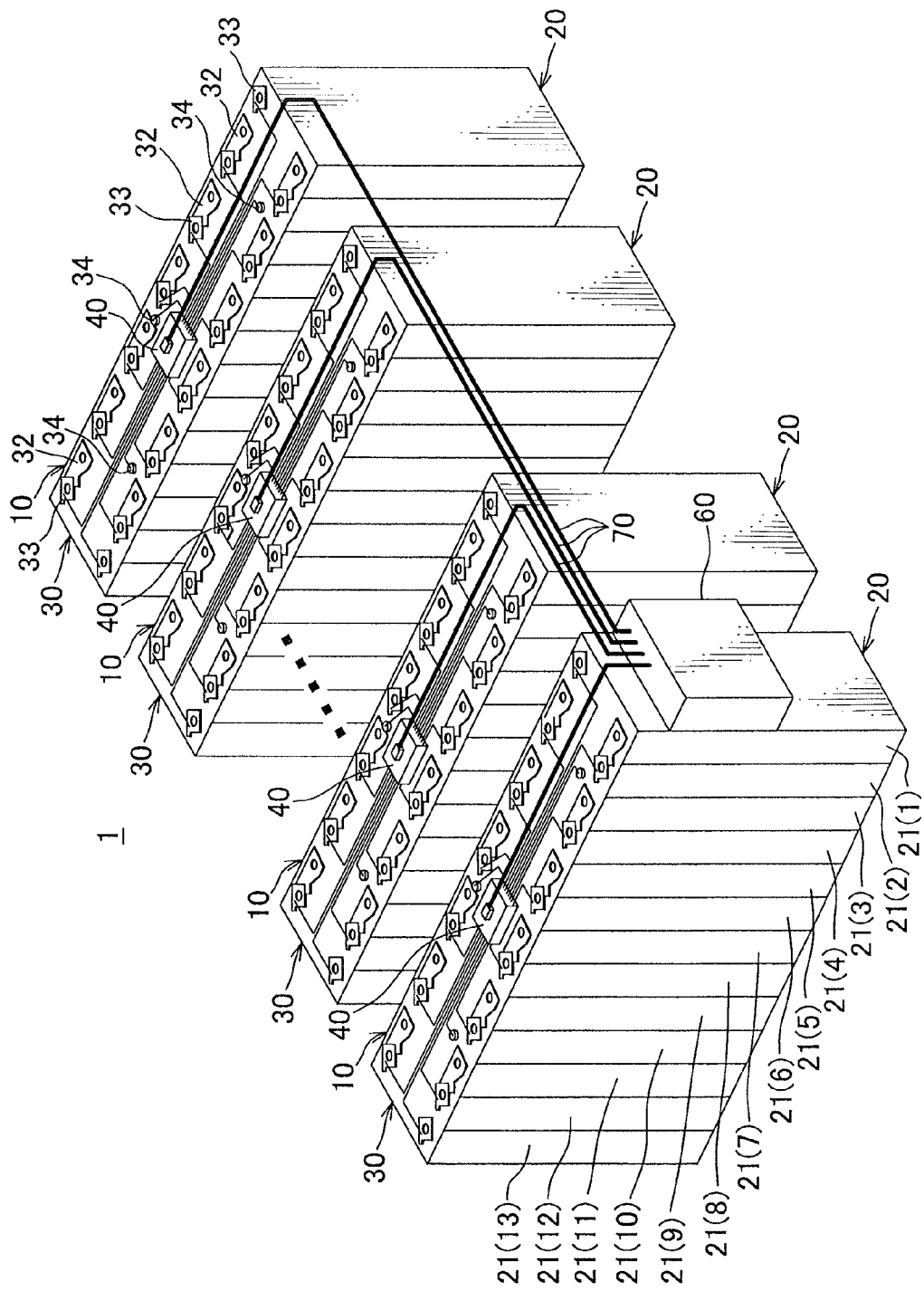
FIG. 18 is a perspective view illustrating a modification of the battery power source system of FIG. 1.

In the present embodiment, for communication with the battery state notifying unit 40 and the battery state monitoring unit 60, multiplex communication protocol is adapted, but not limited to this embodiment. For example, a plurality of downstream communication modules 65 may be disposed in one of the battery state monitoring unit 60, and then the concerned battery state monitoring unit 60 and the plurality of battery packs 10, i.e., the battery state notifying units 40, may be connected on one-on-one basis as shown in FIG. 18.

In the present embodiment, communication between the battery state notifying unit 40 and the battery state monitoring unit 60 is made using serial communication protocol or LIN protocol, but not limited to this embodiment. Instead of LIN protocol, e.g., such CAN (Controller Area Network) protocol may be adapted to communicate. Further, communication between the battery state notifying unit 40 and the battery state monitoring unit 60 may be made by parallel communication.

Figure 19:
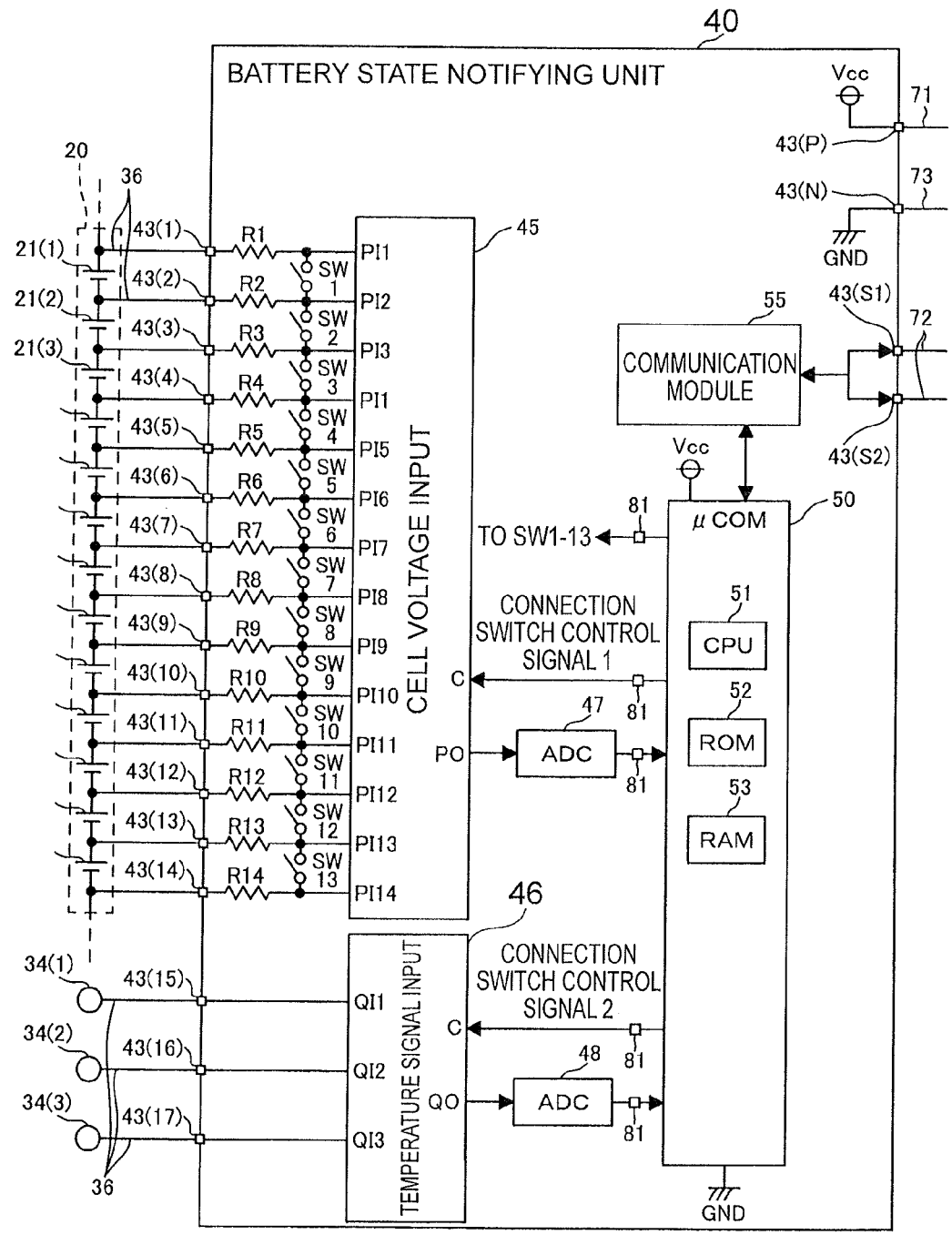
FIG. 19 is a functional block diagram illustrating a modification of the battery state notifying unit of FIG. 6A.

In the present embodiment, the flying capacitor circuit is disposed in the cell voltage input 45 of the battery state notifying unit 40, so as to separate the high voltage part, i.e., high voltage power source, and low voltage part. i.e., low voltage power source, and to transform the high voltage analog signal into the low voltage analog signal, but not limited to this embodiment. For example, in the above-mentioned embodiment as shown in FIG. 19, the cell voltage input 45 may be only composed of multiplexer circuits while the cell voltage input 45, the temperature signal input 46, the first ADC 47, the second ADC 48, and the temperature sensor 34(1) to (3) may be configured to operate with a high voltage power source composed of the battery pack 10 including the battery state notifying unit 40, and insulation component 82 such as a photo coupler may be disposed between (i) the first ADC 47 and μCOM 50, and the second ADC 48 and μCOM 50, (ii) the μCOM 50 and the cell voltage input 45, and the μCOM 50 and the temperature signal input 46, and (iii) the μCOM 50 and each of the discharge switch SW1 to SW3. Such configuration makes it possible to separate a part operative with high voltage power source (the cell voltage input 45, the temperature signal input 46, the first ADC 47, the second ADC 48, the temperature sensor 34(1) to (3), and the discharge switch SW1 to SW3), and a part operative with low voltage power source (the μCOM 50 and the communication module 55), and to transmit information between both parts.

In the present embodiment, the battery state notifying unit 40 is supplied with low voltage power, to be operative with the concerned low voltage power source, but not limited to this embodiment, i.e., whole of the battery notifying unit 40 may be configured to operate with high voltage power composed of the battery pack 10.

Figure 20:
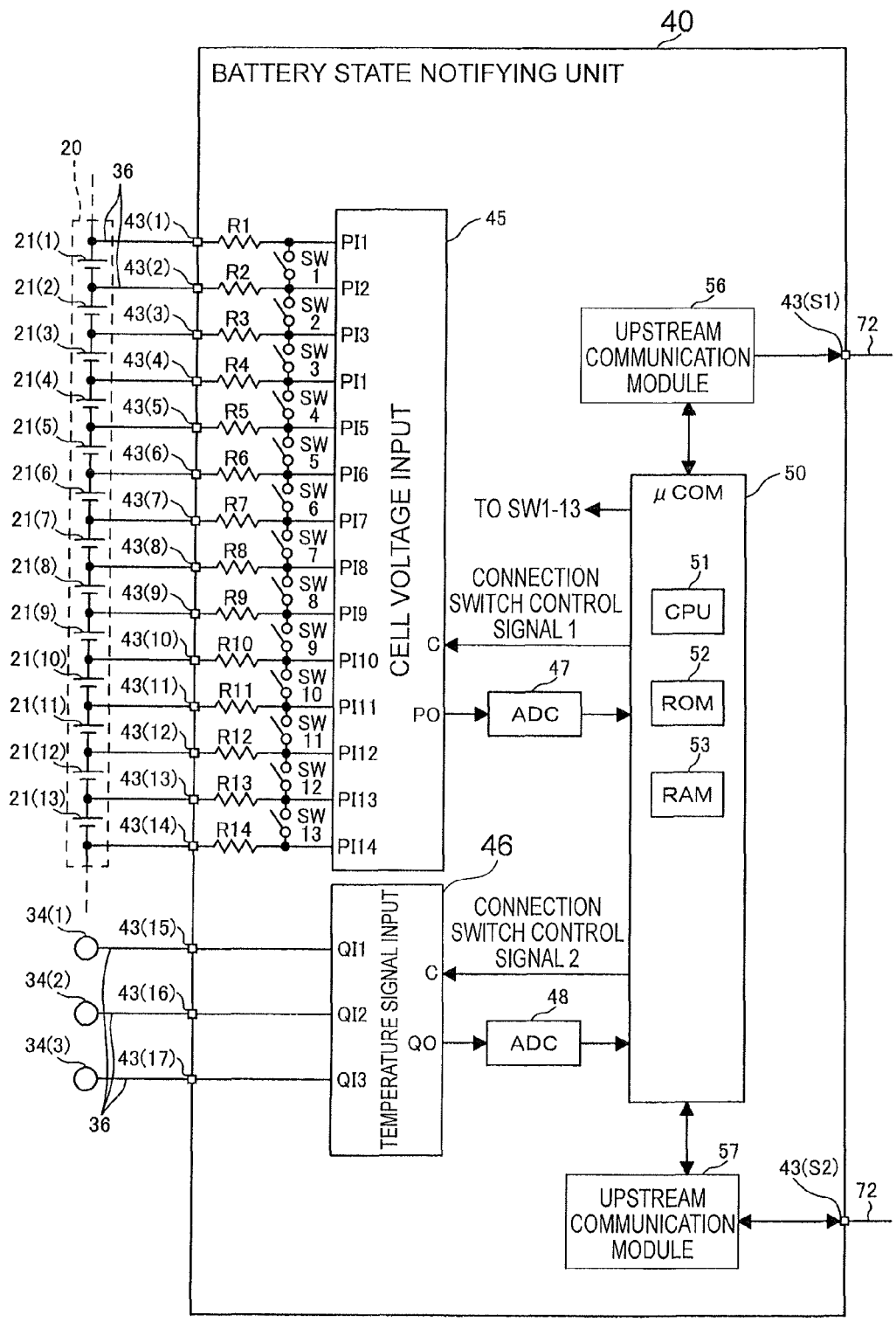
FIG. 20 is a functional block diagram illustrating another modification of the battery state notifying unit of FIG. 6A.

With this configuration, such the downstream communication module 65 of the battery state monitoring unit 60 is provided with an insulation component insulating the high voltage power source and the low voltage power source. The plurality of battery state notifying units 40 is connected by daisy chain connection, i.e., being stung together like beads, instead of bus connection from which each of them hangs down. The battery state notifying unit 40, as shown in FIG. 20, is provided with the upstream communication module 56, and the downstream communication module 57. The upstream communication module 56 is connected to the other battery state notifying unit 40 with higher electric potential farther away from the battery state monitoring unit 60 or a terminator. The downstream communication module 57 is connected to the other battery state notifying unit 40 with lower electric potential nearer the battery state notifying unit 40 or the battery state monitoring unit 60. In each of the battery state notifying units 40, because each of power source electric potentials differs from each other, the upstream communication module 56 and the downstream communication module 57 are provided with a level shift circuit (potential transform circuit) allowing transmission and reception between different power electric potentials.

The μCOM 50, when receiving information from the other battery state notifying unit 40 with higher electric potential via the upstream communication module 56, relaying the information, transmits the information from the downstream communication module 57 to the other battery state notifying unit 40 with lower electric potential or the battery state monitoring unit 60. Further, the μCOM 50, when receiving information from the other battery state notifying unit 40 with lower electric potential or the battery state monitoring unit 60 via the downstream communication module 57, relaying the information if necessary, transmits the information to the other battery state notifying unit 40 with higher electric potential via the upstream communication module 56.

In the present embodiment, while the battery system installed into the hybrid electric vehicle has been discussed, the battery system according to the present invention, of course not limited to the embodiment, i.e., can be adapted for other than the vehicle, for example, a power source device or a power source system such as an emergency backup power source system installed into like a factory where a plurality of secondary battery is combined.

It should be noted that the aforementioned embodiment just shows a typical configuration of the present invention, and the invention is not limited thereto. Namely, it will be obvious to those skilled in the art that various changes may be made without departing from the scope of the invention.

REFERENCE SIGNS LIST 1 battery power source system (battery state monitoring system)
10 battery pack
20 battery module
21 battery cell
21c positive electrode
21d negative electrode
30 bus bar module
31 case
32 bus bar
33 terminal fitting (battery state output)
34 temperature sensor (battery state output)
36 lead wire
40 battery state notifying unit
43 press-connecting terminal
45 cell voltage input
46 temperature signal input
47 first ADC
48 second ADC
50 microcomputer
51 CPU (information generator)
55 communication module (information transmitter)
60 battery state monitoring unit
70 wire harness
71 power source line
72 common signal line
73 ground line
V1-V13 electrode voltage stored area
T1-T3 temperature stored area

The invention claimed is:

1. A battery state monitoring system comprising:
(a) a plurality of battery packs, each battery pack having a plurality of battery cells, a plurality of battery state output devices respectively connected to each of the battery cells, and a single battery state notifying unit connected to the plurality of battery state output devices,
each battery state output device configured to output analog signal data corresponding to a state of each of the plurality of the battery cells of the battery pack,
the single battery state notifying unit including
(i) an information generator configured to generate digital signal battery state data including information indicating a state of each of the plurality of battery cells in response to the analog signal data outputted via the battery state output device; and
(ii) an information transmitter;
(b) one battery state monitoring unit configured to monitor the state of the plurality of battery packs; and
(c) a common signal line connecting the one battery state monitoring unit and the battery state notifying unit,
wherein each information transmitter is configured to transmit the digital signal battery state data generated by the information generator to the one battery state monitoring unit via the common signal line.

2. The battery state monitoring system as claimed in claim 1, wherein the information transmitter is configured to transmit the digital signal battery state data to the one battery state monitoring unit by serial communication.

3. The battery state monitoring system as claimed in claim 2, wherein a communication protocol of the information transmitter is a multiplex communication protocol via the common signal line.

4. The battery state monitoring system as claimed in claim 2, wherein the battery pack is provided with a bus bar module, the bus bar module having a plurality of bus bars electrically connecting the battery cells in series and electrodes of adjacent battery cells to each other, and the battery state notifying unit is disposed in the bus bar module.

5. The battery state monitoring system as claim 4, wherein the one battery state monitoring unit is attached to one of the battery packs.

6. The battery state monitoring system as claimed in claim 2, wherein the one battery state monitoring unit is attached to one of the battery packs.

7. The battery state monitoring system as claimed in claim 3, wherein the battery pack is provided with a bus bar module, the bus bar module having a plurality of bus bars electrically connecting the battery cells in series and electrodes adjacent battery cells to each other, and the battery state notifying unit is disposed in the bus bar module.

8. The battery state monitoring system as claimed in claim 3, wherein the one battery state monitoring unit is attached to one of the battery packs.

9. The battery state monitoring system as claimed in claim 7, wherein the one battery state monitoring unit is attached to one of the battery packs.

10. The battery state monitoring system as claimed in claim 1, wherein communication protocol of the information transmitter is multiplex communication protocol via the common signal line.

11. The battery state monitoring system as claimed in claim 10, wherein the battery pack is provided with a bus bar module, the bus bar module having a plurality of bus bars electrically connecting the battery cells in series and electrodes of adjacent battery cells to each other, and the battery state notifying unit is disposed in the bus bar module.

12. The battery state monitoring system as claimed in claim 11, wherein the one battery state monitoring unit is attached to one of the battery packs.

13. The battery state monitoring system as claimed in claim 10, wherein the one battery state monitoring unit is attached to one of the battery packs.

14. The battery state monitoring system as claimed in claim 1, wherein the battery pack is provided with a bus bar module having a plurality of bus bars electrically connecting the battery cells in series and electrodes of adjacent battery cells to each other.

15. The battery state monitoring system as claimed in claim 14, wherein the one battery state monitoring unit is attached to one of the battery packs.

16. The battery state monitoring system as claimed in claim 1, wherein the one battery state monitoring unit is attached to one of the battery packs.

17. A battery state notifying unit disposed in a battery pack having a plurality of battery cells, a plurality of battery state output devices respectively connected to each of the battery cells, and a single battery state notifying unit connected to the plurality of battery state output devices, each of the plurality of battery state output devices outputting analog signal data corresponding to a state of each of the plurality of battery cells of the battery pack, the battery state notifying unit singly disposed in the battery pack, the battery state notifying unit comprising:
- an information generator generating a digital signal battery state data including information indicating the state of each of the plurality of battery cells corresponding to the analog signal data outputted via each of the plurality of battery state output devices; and
- an information transmitter transmitting the digital signal battery state data generated by the information generator to a location external to the battery pack.

18. A bus bar module comprising:
the battery state notifying unit as claimed in claim 17; and
a plurality of bus bars connecting electrodes of the plurality of battery cells to each other.

19. A battery pack, comprising:
the battery state notifying unit as claimed in claim 17.

* * * * *